United States Patent
Kitano et al.

(10) Patent No.: US 7,995,634 B2
(45) Date of Patent: Aug. 9, 2011

(54) NITRIDE SEMICONDUCTOR LASER ELEMENT

(75) Inventors: Akira Kitano, Komatsushima (JP); Ken Katsuragi, Anan (JP); Hiroaki Matsumura, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 10/594,422

(22) PCT Filed: Mar. 10, 2005

(86) PCT No.: PCT/JP2005/004249
§ 371 (c)(1),
(2), (4) Date: Sep. 26, 2006

(87) PCT Pub. No.: WO2005/093919
PCT Pub. Date: Oct. 6, 2005

(65) Prior Publication Data
US 2007/0217458 A1    Sep. 20, 2007

(30) Foreign Application Priority Data

Mar. 26, 2004  (JP) ................. 2004-092656
Mar. 2, 2005   (JP) ................. 2005-057761

(51) Int. Cl.
*H01S 5/00*   (2006.01)
*H01S 5/323*  (2006.01)

(52) U.S. Cl. ............. 372/46.015; 372/43.01; 372/45.01; 372/46.01; 372/46.016

(58) Field of Classification Search ............ 372/46.015, 372/46.016, 46.01, 43.01, 45.01
See application file for complete search history.

(56) References Cited

U.S. PATENT DOCUMENTS

| 5,138,626 | A | * | 8/1992 | Yap ........................... 372/46.016 |
| 5,497,391 | A | * | 3/1996 | Paoli ........................ 372/50.122 |
| 6,291,256 | B1 | * | 9/2001 | Chen et al. ..................... 438/32 |
| 6,661,822 | B1 | * | 12/2003 | Kubota et al. ............. 372/46.01 |
| 6,697,407 | B2 | * | 2/2004 | Nagashima et al. ....... 372/46.01 |
| 6,811,324 | B2 | * | 11/2004 | Morse .............................. 385/88 |
| 2001/0006529 | A1 | * | 7/2001 | Komori et al. .................. 372/96 |
| 2004/0124500 | A1 | * | 7/2004 | Kawagoe ....................... 257/548 |
| 2004/0264533 | A1 | * | 12/2004 | Matsumura et al. ........... 372/45 |

FOREIGN PATENT DOCUMENTS

| JP | 51-83487 | 7/1976 |
| JP | 60-247988 | 12/1985 |

(Continued)

OTHER PUBLICATIONS

International Search Report for PCT/JP2005/004249 mailed Apr. 26, 2005.

(Continued)

*Primary Examiner* — Minsun Harvey
*Assistant Examiner* — Michael Carter
(74) *Attorney, Agent, or Firm* — Nixon & Vanderhye, P.C.

(57) ABSTRACT

A nitride semiconductor laser element exhibits high-speed responsiveness by largely reducing the capacitance of the nitride semiconductor laser element. The nitride semiconductor laser element includes an n-type semiconductor layer, an active layer and a p-type semiconductor layer each laminated on the main surface of the substrate. The nitride semiconductor laser element further includes a striped ridge portion formed in the p-type semiconductor layer, and pn-junctions of the semiconductor layer in the peripheral region remote from the ridge portion are broken by ion implantation to form an insulative region for reducing the capacitance of the element.

20 Claims, 11 Drawing Sheets

FOREIGN PATENT DOCUMENTS

| | | |
|---|---|---|
| JP | 62-43193 | 2/1987 |
| JP | 63-222488 A | 9/1988 |
| JP | 5-190980 A | 7/1993 |
| JP | 10-41583 | 2/1998 |
| JP | 2000-183459 | 6/2000 |
| JP | 2001-210914 | 8/2001 |
| JP | 2002-237661 A | 8/2002 |
| JP | 2003-31909 | 1/2003 |
| JP | 2003-69153 | 3/2003 |
| JP | 2003-264346 A | 9/2003 |

OTHER PUBLICATIONS

Office Action issued in related Japanese Appln. No. 2005-057761 (Apr. 25, 2011) w/English language translation.

* cited by examiner

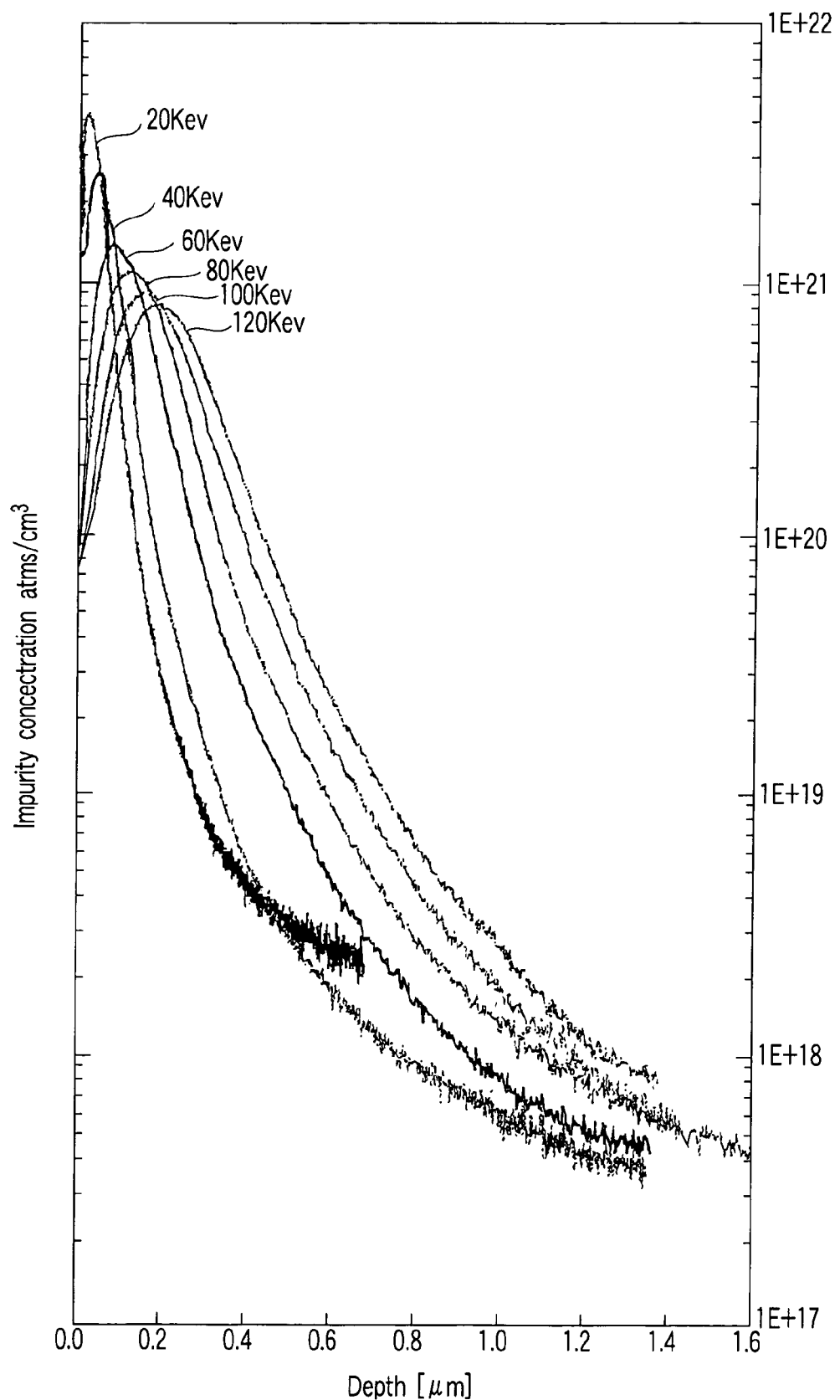
F I G. 5

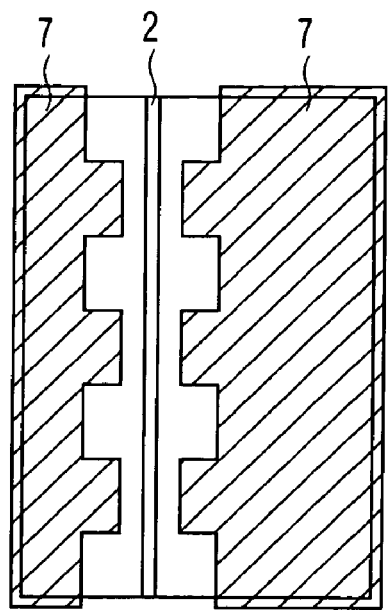
F I G. 9
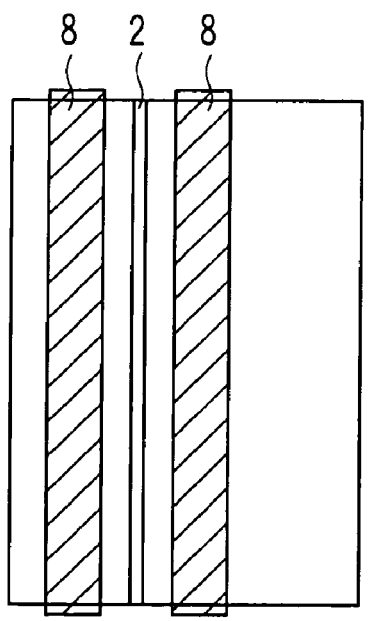
F I G. 10

NITRIDE SEMICONDUCTOR LASER ELEMENT

This application is the US national phase of International application PCT/JP2005/04249 filed 10 Mar. 2005, which designated the U.S. and claims priority of JP 2004-092656 filed 26 Mar. 2004; and JP 2005-057761 filed 2 Mar. 2005, the entire contents of each of which are hereby incorporated by reference.

TECHNICAL FIELD

The present invention relates to a nitride semiconductor laser element, and particularly to an insulation structure of peripheral regions of a waveguide region for a laser light. The semiconductor element is used, for example, for a laser diode (LD) for emitting a bluish-purple light.

BACKGROUND ART

An LD for emitting blue light having a short wavelength as a light source capable of high-density read/write of information from/to an optical disk device (such as a CD or DVD), as well as an LD for emitting bluish-purple light (abbreviated as bluish-purple LD hereinafter) for higher read/write density, have been considered promising. In addition, high-speed responsiveness of the bluish-purple LD has been required for further increasing the read/write speed (for example, double speed reading) of the DVD.

Jpn. Pat. Appln. KOKAI Publication No. 2001-10914 discloses a structure having a rich layer abundant in Al or B near the surface of a semiconductor layer continuously from the side face of a striped ridge of a laser element, in order to prevent leakage current and short circuiting of the laser element.

Jpn. Pat. Appln. KOKAI Publication No. 2003-31909 discloses a GaN semiconductor compound laser element having a striped ridge waveguide, wherein a light absorbing region is formed by introducing impurity atoms by ion implantation at a position remote from the region immediately under the ridge in order to prevent an adverse effect due to light leaking from the waveguide region.

DISCLOSURE OF INVENTION

While there are many methods for obtaining high-speed LDs, one method may be to shorten responsiveness (rise time tr and fall time tf) with respect to input of pulse drive current by reducing an RC time constant (R denotes resistance and C denote capacitance of an element) of an equivalent circuit of LDs.

In general, the capacitance of the LD element depends on its structure and material, or largely depends on the area of the ridge, the material and thickness of an embedded insulation film covering the surface of a semiconductor layer, and the material and thickness of a protective insulation film covering the embedded insulation film. When area of a p-electrode opposed to a p-type layer is represented by S, dielectric constant of an inter-electrode insulation film of the element is represented by $\epsilon$, and thickness of the inter-electrode insulation film is represented by d, the capacitance C of the element depends on $S \times \epsilon/d$. The capacitance of the portion where the p-electrode faces the p-layer with interposition of the thin embedded insulation film and the capacitance of a pn-junction between a p-type layer and n-type active layer are aligned in series in peripheral regions near the waveguide region. The capacitance of the portion where the p-electrode faces the p-type layer with interposition of a laminated insulation films in which a relatively thick protective insulation film and a thin embedded insulation film are laminated, and the capacitance of a pn-junction between a p-type layer and n-type active layer are aligned in series in the peripheral region of the waveguide region.

The inventors of the present invention have made repeated studies for largely reducing the capacitance of the element of the bluish-purple LD, and found that it is effective to reduce the capacitance at the peripheral region of the waveguide region as much as possible, or to nullify the capacitance.

The present invention is accomplished based on the above-mentioned discoveries, and it is an object of the present invention to provide a nitride semiconductor laser element that is capable of complying with a requirement of high-speed responsiveness by largely reducing the capacitance of the element.

A first embodiment of the invention provides a nitride semiconductor laser element comprising: a semiconductor layer of a first conductivity type, an active layer and a semiconductor layer of a second conductivity type, which are stacked one upon the other and each comprises a nitride; a striped waveguide region for a laser light provided on the semiconductor layer of the second conductivity type; and an insulative region for reducing the capacitance of the element, wherein a pn-junction of the semiconductor layer at a peripheral region remote from the waveguide region is broken.

A second embodiment of the invention provides a nitride semiconductor laser element comprising: a semiconductor layer of a first conductivity type, an active layer and semiconductor layers of a second conductivity type, which are staked one upon the other and each comprises a nitride; a striped waveguide region for a laser light provided on the semiconductor layer of the second conductivity type; and an insulative region for reducing the capacitance of the element having no depletion layer in the semiconductor layer at a peripheral region remote from the waveguide region.

A third embodiment of the invention provides a nitride semiconductor laser element comprising: a substrate; a semiconductor layer of a first conductivity type, an active layer and a semiconductor layer of a second conductivity type, which are stacked on a main surface of the substrate and each comprises a nitride; a striped waveguide region for a laser light provided on the semiconductor layer of the second conductivity type; an embedded insulation film covering a side face of the waveguide region and a surface of the semiconductor layer of the second conductivity type; a first electrode in contact with a surface of the waveguide region; a protective insulation film covering at least a part of the embedded insulation film; a second electrode substantially connected to the semiconductor layer of the first conductivity type; and an insulative region for reducing the capacitance of the element, provided by converting at least a part of the semiconductor layer at a peripheral region remote from the waveguide region into a higher resistance one by ion implantation.

A fourth embodiment of the invention provides a nitride semiconductor laser element comprising: a semiconductor layer of a first conductivity type, an active layer and a semiconductor layer of a second conductivity type being different from the first conductivity type, which are stacked on a main surface of a substrate and each comprises a nitride; and a striped waveguide region for a laser light provided on the semiconductor layer of the second conductivity type, wherein at least a part of the semiconductor layer of the second conductivity type serves as a region for reducing the capacitance of the element by being converted into the first conductivity type in a direction of thickness at a peripheral region remote from the waveguide region.

A fifth embodiment of the invention provides a nitride semiconductor laser element comprising: a semiconductor layer of a first conductivity type, an active layer and a semiconductor layer of a second conductivity type, which are staked one upon the other and each comprises a nitride; a striped waveguide region of a laser light provided on the semiconductor layer of the second conductivity type; and an insulative region having a withstand voltage of 10V or more at a region other than the waveguide region in the semiconductor of the second conductivity type.

A sixth embodiment of the invention provides a bluish-purple light emitting laser element comprising: a semiconductor layer of a first conductivity type, an active layer and a semiconductor layer of a second conductivity type, which are stacked one upon the other and each comprises a nitride; and a striped waveguide region of a laser light provided on the semiconductor layer of the second conductivity type, wherein the element comprises an insulation region for reducing the capacitance of the element in a peripheral region remote from the waveguide region, and wherein responsiveness of the element with respect to input of a pulse drive current is 1 ns or less.

BRIEF DESCRIPTION OF DRAWINGS

FIG. 5 is an illustrative characteristic graph showing an example of the distribution of the impurity concentration in the depth direction of an insulation region formed by ion implantation into the semiconductor portion of the LD in FIG. 1.

FIG. 9 is a schematic illustration showing a different example of a planar relation between the semiconductor layer including the ridge portion in FIG. 1 and the ion-implanted region.

FIG. 10 is a schematic illustration showing a further different example of a planar relation between the semiconductor layer including the ridge portion in FIG. 1 and the ion-implanted region.

BEST MODE FOR CARRYING OUT THE INVENTION

Figure 1:
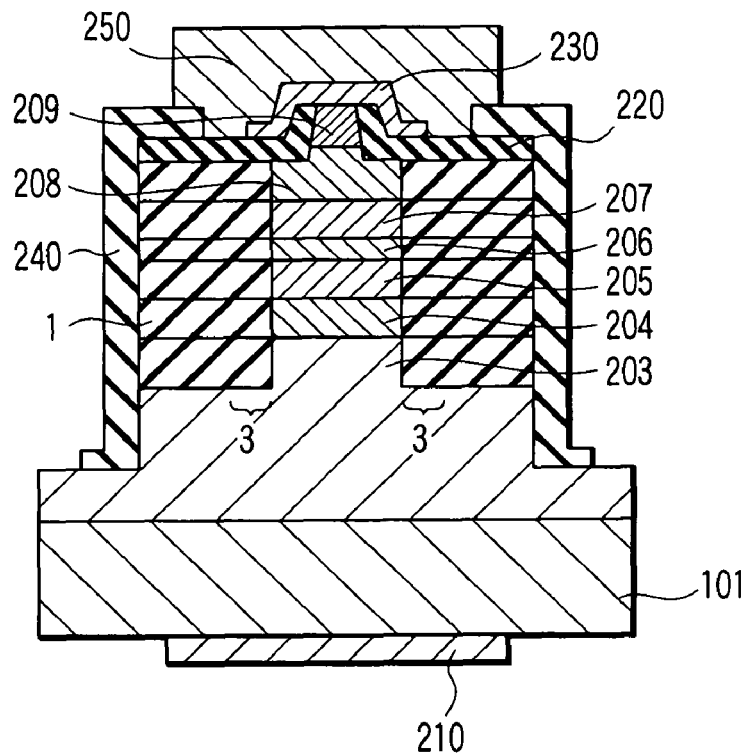
FIG. 1 is a schematic illustration of an example of the cross-section of the LD according to a first embodiment of the invention.

The embodiments of the invention will be described hereinafter with reference to the drawings. The same reference numerals are given to the same or similar parts in the entire drawings in this description.

First Embodiment

In a first embodiment, ions were implanted (or protons were irradiated) into a semiconductor layer at a peripheral region a given distance or more remote from a waveguide region of a bluish-purple LD under a given condition to break pn-junctions in the region or to allow the semiconductor region to have no depletion layers, thereby converting that region into a higher resistance one (or into an insulation film). No depletion layers are formed and no pn-junction capacitance is generated in the insulative region formed into the insulation film. It is preferable in this case to allow a desired effect of reducing the capacitance of the element to be obtained by noticing a relation between a peak concentration of impurities and the distribution of the impurity concentration in the depth direction, and the effect of reducing the capacitance of the element. The insulative region has a withstand voltage of, for example, 10V or more.

FIG. 1 is a schematic illustration of an example of the cross-sectional structure when the LD according to the first embodiment is cut in a direction perpendicular to the laser resonance direction (in a direction parallel to the resonance surface). The structure of opposed electrodes is shown in this drawing, where a pair of electrodes of the LD are separated into upper and lower surfaces of a chip.

In the LD shown in FIG. 1, semiconductor layers of a first conductivity type (203 and 204), an active layer 205 and semiconductor layers of a second conductivity type (206 to 209) different from the first conductivity type are sequentially grown and laminated on a first main surface of a substrate 101. Each of the semiconductor layers (201 to 204) of the first conductivity type comprises a nitride semiconductor layer containing aluminum (Al).

Ridge portions each having planar stripes and a protruded cross-section are formed on upper parts 209 and 208 of the semiconductor layers of the second conductivity type as waveguide regions for narrowing an electric current, and resonance surfaces are formed at edge surfaces so that the resonance surface is approximately perpendicular to these waveguide regions. A thin embedded insulation film 220 covering the side face of the waveguide region and the upper surface of the semiconductor layer of the second conductivity type, a first electrode 230 making ohmic contact with the surface of the waveguide region and covering the upper surface of the waveguide region and a part of the surface of the embedded insulation film 220, and a protective insulation film 240 are further formed. The protective insulation film 240 is formed so as to cover at least a part of the surface of the embedded insulation film 220, and side faces of a part of the semiconductor layers (206 to 209) of the second conductivity type, the active layer 205 and a part of the semiconductor layers (203 and 204) of the first conductivity type. The protective insulation film 204 may be formed so as to cover the entire surface of the embedded insulation film 220 as well as the side edge of the first electrode 230. A pad electrode 250 is formed on the first electrode, and a second electrode 210 is formed so as to contact a second main surface of the substrate 101. The pad electrode 250 on the first electrode is formed so as to cover a part of the surface of the protective insulation film 240. The second electrode 210 is substantially in electrical contact with the semiconductor layer of the first conductivity type via the substrate 101.

An insulative region 1, for reducing the capacitance of the element, is formed in this embodiment by converting the region into a higher resistance one by ion implantation into a peripheral region a given distance or more remote from the waveguide region. Since the ions are implanted before forming the embedded insulation film 220, it is possible to form the insulative region 1 having a desired distribution of the impurity concentration in the depth direction with good controllability by appropriately controlling ion implantation conditions such as the dosage and acceleration voltage (depth of implantation). The ion species available include aluminum (Al), indium (In), boron (B), oxygen (O), nitrogen (N), hydrogen (H), phosphor (P) and antimony (Sn), wherein the insulative region 1 for reducing the capacitance of the element has either a leakage light absorbing function as disclosed in patent document 2(such as Al), or lower light absorption effect (such as B, O, N and H) depending on the ion species used.

The insulative region 1 for reducing the capacitance of the element that is made to have high electrical resistance by ion implantation is desirably formed at a distance in the range from 0.5 µm to 10 µm from the waveguide region (ridge portion), and at least under the first electrode 230 or pad electrode 250.

Figure 2A:
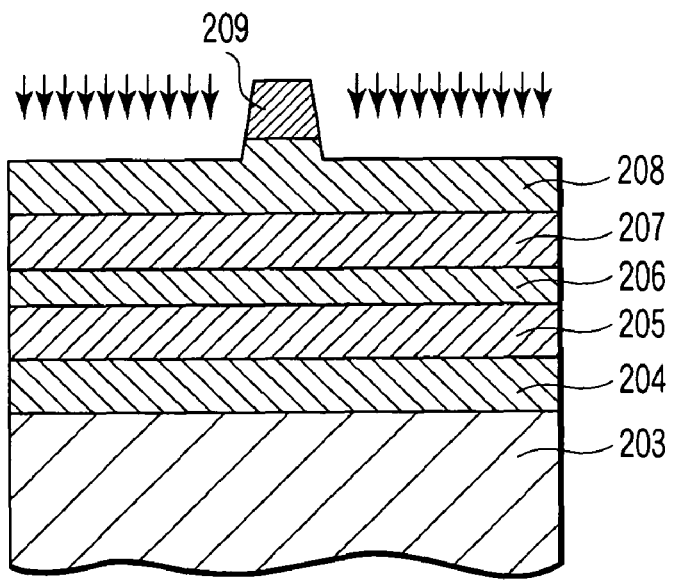
FIG. 2A is a schematic illustration of the cross-section of a semiconductor layer portion at the ridge and in the vicinity thereof of the LD in FIG. 1.
Figure 2B:
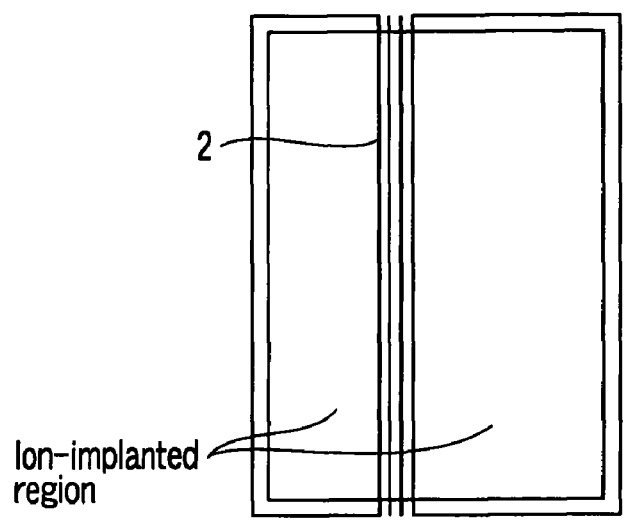
FIG. 2B is a schematic illustration of a relation between a plane pattern of a semiconductor layer portion at the ridge and in the vicinity thereof of the LD and an ion-implanted region.

FIG. 2A is a schematic illustration of the cross-sectional structure of the semiconductor layer part at the ridge portion of the LD in FIG. 1 and in the vicinity thereof. FIG. 2B is a schematic illustration of the relation between a planar pattern of the semiconductor layer part at the ridge portion of the LD in FIG. 1 and in the vicinity thereof and the ion-implanted region.

When the width of the ridge portion 2 is about 1.6 µm and the entire width of the region for maintaining safety zones (a width considering migration of introduced atoms by thermal diffusion) at the ridge portion and both sides thereof is about 5 µm in FIGS. 2A and 2B, the distance (separated distance) from the ridge portion 2 to the insulative region (reference numeral 1 in FIG. 1) for reducing the capacitance of the element is about 1.7 µm. A material having a low dielectric constant (for example, $ZrO_2$ film) is used for the embedded insulation film 220.

According to the above-mentioned construction of the LD, the insulative region 1, which has an increased electrical resistance (or is insulated) by ion implantation, is formed in at least a part of the semiconductor layer of the second conductivity type of the peripheral region a given distance or more remote from the waveguide region, or to a depth reaching the semiconductor layer 203 of the first conductivity type in this embodiment. The pn-junction is broken in this insulative region 1, and no depletion layers are formed, thereby forming no pn-junctions.

The capacitance is reduced in this construction because a thick insulation film including the embedded insulation film 220 and the insulative region 1 is formed between the first electrode 230 and the second electrode 210 in the region where the first electrode 230 contacts the embedded insulation film 220 at the peripheral region remote from the waveguide region. In addition, in the region where the pad electrode 250 contacts the protective insulation film 240, the capacitance is further reduced since a thick insulation film including the protective insulation film 240, the embedded insulation film 220 and the insulative region 1 is formed between the pad electrode 250 and the second electrode 210.

It is instructive to notice the relation between the peak impurity concentration and the distribution of the impurity concentration in the depth direction in the insulative region 1, and the effect of reducing the capacitance of the element in order to obtain a desired effect of reducing the capacitance of the element. Accordingly, ion implantation is devised so that ions are implanted several times by changing, for example, the acceleration voltage in order to obtain a desired effect of reducing the capacitance of the element. This enables the capacitance of the LD element to be largely reduced, thereby complying with the requirement of high-speed response as will be described hereinafter.

FIG. 5 is a characteristic graph illustrating the distribution of the impurity concentration in the depth direction of the insulative region 1 formed by ion implantation in the semiconductor layer portion of the LD in FIG. 1.

Figure 6A:
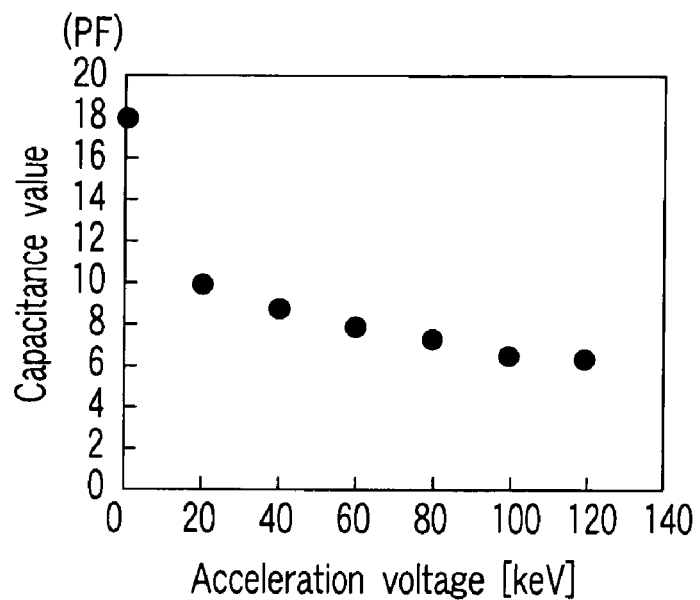
FIG. 6A is an illustrative characteristic graph showing an example of the relation between the acceleration voltage and the effect of reducing the capacitance of the element when ions are implanted for forming an insulation region in the semiconductor layer portion of the LD in FIG. 1.
Figure 6B:
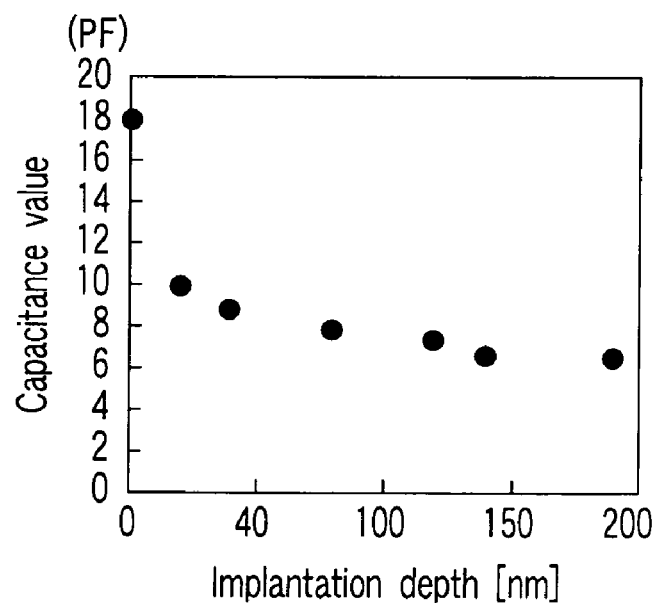
FIG. 6B is an illustrative characteristic graph showing an example of the relation between an implantation depth and the effect of reducing the capacitance of the element when ions are implanted for forming an insulation region in the semiconductor layer portion of the LD in FIG. 1.

FIG. 6A is a characteristic graph illustrating an example of the relation between the acceleration voltage and the effect of reducing the capacitance of the element when ions are implanted for forming the insulative region in the semiconductor layer portion of the LD in FIG. 1. FIG. 6B is a characteristic graph illustrating an example of the relation between the implantation (peak) depth and the effect of reducing the capacitance of the element when ions are implanted for forming the insulative region in the semiconductor layer portion of the LD in FIG. 1.

According to FIG. 5, it was revealed that the effect of reducing the capacitance of the element increases when the peak impurity concentration in the insulative region 1 is controlled in the range from $1 \times 10^{18}$ to $5 \times 10^{21}$ atms/cm³, and the concentration distribution is adjusted so that the peak impurity concentration in the depth direction lies in the range from 20 nm to 1 μm, preferably in the range from 30 nm to 200 nm, from the surface of the semiconductor layer of the second conductivity type. This enables the insulative region 1 for reducing the capacitance of the element to be formed with good controllability by ion implantation.

While ions may be implanted once, it is possible to implant the ions plural times with an arbitrary combination of ion species, dosage and acceleration voltage.

When ions are implanted once, the capacitance of the element is, for example, 8 pF at a dosage of $3\times10^{16}$ atms/cm$^2$ and an acceleration voltage of 60 KeV. This shows a capacitance reduction rate of about 20% as compared with the capacitance of the element (10 pF) when ions are implanted at an acceleration voltage of 20 KeV. The capacitance of the element is reduced to about 6.7 pF when ions are implanted at an acceleration voltage of 100 KeV.

When ions are implanted plural times (for example, three times), the acceleration voltage may be changed to 30 KeV, 45 KeV or 60 KeV for each implantation at a dosage of $1\times10^{16}$ atms/cm$^2$ in order to permit the insulative region 1 to acquire a light absorption effect and a light confinement effect. It is also possible to adjust the refractive index with respect to the laser light by using different ion species for each ion implantation. Doping of In into the nitride film semiconductor permits the refractive index to be increased, while doping of Al or B permits the refractive index to be decreased.

Figure 7:
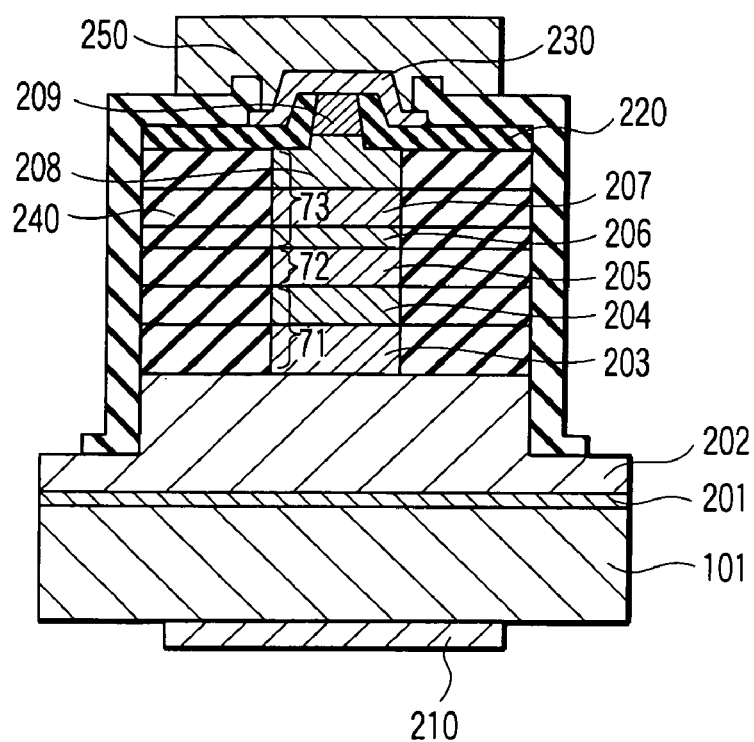
FIG. 7 is a schematic illustration of an example of the cross-sectional structure of the LD when ions are implanted plural times by changing ion species for forming an insulation region in the semiconductor layer portion of the LD in FIG. 1.

For example, the light confinement effect can be increased by implanting B into the layers below the active layer, In into the active layer region and Al into the layers above the active layer when ions are implanted three times. FIG. 7 is a schematic illustration of an example of the cross-sectional structure of the LD in this case. In FIG. 7, the reference numeral 71 denotes a B-implanted layer, the reference numeral 72 denotes an In-implanted layer and the reference numeral 73 denotes an Al-implanted layer. Other portions are given the same reference numerals as those in FIG. 1.

When ions are implanted twice, for example when Al ions are implanted at an acceleration voltage of 60 KeV and B ions are implanted at an acceleration voltage of 30 KeV each at a dosage of $1\times10^{16}$ atms/cm$^2$ in order to form a B-implanted layer and an Al-implanted layer in this order from the surface of the semiconductor layer of the second conductivity type, the light leaking to the substrate side may be efficiently absorbed with the Al-implanted layer. In addition, ripples (noises) superimposed on the laser light may be suppressed by simultaneously changing the dosage and acceleration voltage when ions are implanted plural times.

A desired compound may be obtained by implanting different ion species into a region at the same depth, when ions are implanted plural times (for example twice). For example, AlN can be obtained by implanting Al at a first run and N at a second run, AlO can be obtained by implanting Al at a first run and O at a second run, and BN can be obtaining by implanting B at a first run and N at a second run. Further, SiO$_x$ can be obtained by implanting Si and O at the same depth as different ion species.

The effect of reducing the capacitance of the element may be also achieved by implanting the ions into only a part of the semiconductor layers (206 to 209) of the second conductivity type without implanting the ions into the active layer 205, when the ions are implanted as described above to form the insulative region 1 so that the impurity concentration peak is formed at the surface layer of the semiconductor layers (206 to 209) of the second conductivity type.

The effect of reducing the capacitance of the element may be also achieved by implanting the ions to a depth reaching a part of the semiconductor layers (203, 204) of the first conductivity type to form the insulative region 1 so that the impurity concentration peak is formed in the active layer 205.

The nitride semiconductor laser element according to the first embodiment has an insulative region (high resistance region) for reducing the capacitance of the element, wherein the pn-junction of the semiconductor layer at the peripheral region remote from the waveguide region is broken by ion implantation (or the semiconductor layer has no depletion layers). This construction permits the capacitance of the element to be largely reduced to enable the element to comply with the requirement of high-speed response. In addition, an insulative region for reducing the capacitance of the element with a withstand voltage of 10V or more may be formed at the outside of the waveguide region in the semiconductor layer.

When the above-mentioned semiconductor laser element is applied to a laser element for emitting a bluish-purple light, both the rise time and fall time of the pulse drive current that are factors for determining responsiveness with respect to input of the pulse drive current may be reduced to 1 ns or less, or to 0.5 ns or less. Accordingly, read/write speed may be doubled by using the semiconductor laser element for emitting a bluish-purple light as a read/write light source of DVDs.

Modified Example of First Embodiment

The insulative region 1 for reducing the capacitance of the element may be formed at least at a part of the semiconductor layer of the peripheral region remote from the waveguide region.

For example, when the pad electrode 250 is formed so that it covers a part of the surface of the protective insulation film 240 while it contacts the surface of the first electrode 230, the desired effect of reducing the capacitance of the element may be obtained by forming the insulative region 1 only in the region below the pad electrode 250.

When the first electrode 230 is formed so as to cover a part of the surface of the embedded insulation film 220, on the other hand, the desired effect of reducing the capacitance of the element may be obtained by forming the insulative region 1 for reducing the capacitance of the element only in the region below the embedded insulation film 220. The desired effect of reducing the capacitance of the element may be also obtained by forming the insulative region by ion implantation only into the region below the first electrode 230 (indicated by 3 in FIG. 1) on the surface of the embedded insulation film 220 of the peripheral regions a given distance or more remote from the waveguide region.

The planar position of the portion for forming the insulative region is not restricted to the entire surface of the peripheral region a given distance or more remote from the ridge portion 2 as shown in FIG. 2B. Instead, the insulative region may be formed only at a portion of the peripheral region a given distance or more remote from the ridge portion 2 by defining an ion-implanted region as shown in FIGS. 8 to 10.

Figure 8:
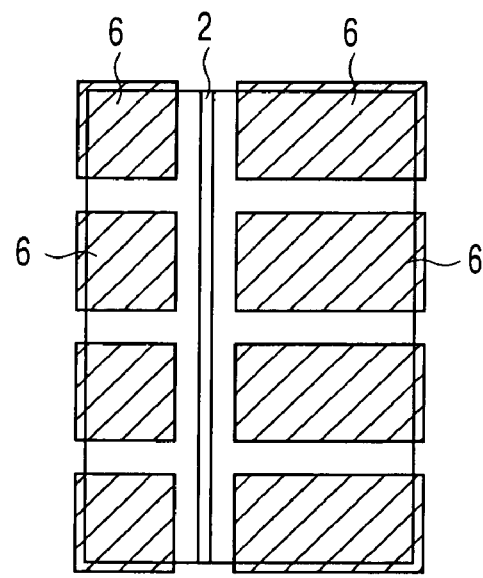
FIG. 8 is a schematic illustration showing another example of a planar relation between the semiconductor layer including the ridge portion in FIG. 1 and the ion-implanted region.

FIGS. 8 to 10 are schematic illustrations showing a planar positional relation between the semiconductor layer including the ridge portion and ion-implanted region in FIG. 1.

In the example shown in FIG. 8, ion-implanted regions 6 are provided by being divided into a plurality of regions a given distance (for example 50 μm) apart in a direction along the ridge portion 2 in the peripheral region of the ridge portion 2, and ions are not implanted between the regions. In the example shown in FIG. 9, ion-implanted regions 7 are provided so that the portion facing the ridge portion 2 is rugged in the peripheral region of the ridge portion 2. The length of each of the convex portion and concave portion of the staggered portions of the ion-implanted region along the direction of the ridge portion 2 is, for example, 30 μm. Further, in the example shown in FIG. 10, ion-implanted regions 8 are provided only in a part of the region (for example in the region with a width of 30 μm) in the direction of the width (in the direction perpendicular to the direction of the ridge portion 2) in the peripheral region of the ridge portion 2. The ion-implanted regions may be provided in this case so that the insulative region 1 is formed only in the region (the reference numeral 3 in FIG. 1) below the first electrode 230 of the embedded insulation film 220 in FIG. 1.

A part of the constituting elements of the LD of the above-mentioned first embodiment will be described in detail below.

(Substrate)

The substrate 101 for growing the nitride film semiconductor layer is preferably made of the same material as used in the semiconductor, because no problem of lattice mismatch and the like occurs when the substrate comprises the same material as used in the semiconductor. Dislocations generated on the surface of the substrate are required to be reduced in the substrate for growing the semiconductor in order to improve the characteristics of the semiconductor element. The substrate is also required to be cleavable for forming chips of the semiconductor element from the wafer of the substrate on which the semiconductor was grown.

While the substrate is preferably a single-component substrate consisting of a single semiconductor, a conductive or an insulative substrate totally or partially comprising dissimilar materials different from the semiconductor in the single-component substrate may be also used. The semiconductor of the elementary substrate is a compound semiconductor such as a group III-V compound semiconductor or group II-VI compound semiconductor. Specific examples include GaN compound semiconductors, GaAs compound semiconductors and ZnO compound semiconductors. The above-mentioned dissimilar materials are sapphire, SiC, Si, spinel, $SiO_2$, SiN and the like.

When a conductive substrate having first and second principal faces is used, a semiconductor layer and an electrode are sequentially formed on the first main surface side, and a nitride semiconductor laser element having an opposed electrode structure with an electrode formed on the second main surface side may be obtained. Input of large electric current is possible in this laser element, and the element can emit a light with a high output power.

(Semiconductor layer of the first conductivity type, active layer and semiconductor layer of the second conductivity type)

The semiconductor layer of the first conductivity type, active layer and semiconductor layer of the second conductivity type are made of a compound semiconductor, or a nitride semiconductor in the invention. The nitride semiconductor is represented by a general formula of $In_xAl_yGa_{1-x-y}$ ($0 \leq x \leq 1$, $0 \leq y \leq 1$, $0 \leq x+y \leq 1$).

For example, the first semiconductor layer has an n-type nitride semiconductor, and the second semiconductor layer has an inverse conductivity type (p-type) nitride semiconductor different from the n-type nitride semiconductor. The n-type nitride semiconductor contains at least one of Si, Ge, O and the like as n-type impurities, while the p-type nitride semiconductor contains Mg, Zn and the like as p-type impurities. The active layer has either a multi-quantum well structure or a single quantum well structure.

(Waveguide Region)

The waveguide region is striped and propagates a light. The propagated light is amplified by being resonated on a resonance surface and generates laser light. The waveguide region is a narrowing region that enables an electric current to be efficiently injected, and the cross-sectional shape of the narrowing region is preferably protruded, since this structure permits the light to be confined.

An example of the method for producing the semiconductor laser element of the first embodiment will be described below with reference to FIG. 1. A substrate having a first main surface and second main surface is used in the first embodiment. A semiconductor layer is laminated on the first main surface, while an electrode is formed on the second main surface. The semiconductor layer has a separated confinement hetero-structure (SCH) in which an active layer is inserted between the semiconductor layer of the first conductivity type and the semiconductor layer of the second conductivity type. This structure permits an optical waveguide to be formed by providing an optical guide layer having a larger band gap than the active layer above and below the active layer.

(First Step)

A semiconductor layer is first grown on the substrate. A nitride semiconductor substrate 101 is used as the substrate in this example. The nitride semiconductor substrate 101 comprises GaN or AlN as a compound of group III element such as B, Ga, Al and In with nitrogen, or AlGaN or InAlGaN as a three- or four-component mixed crystal compound. The nitride semiconductor substrate may also contain n-type impurities or p-type impurities.

There are various methods for producing the nitride semiconductor substrate. After allowing a nitride semiconductor layer having reduced dislocations to grow on a different kind of substrate (hetero-substrate) comprising different materials from the nitride semiconductor by a vapor phase growth method such as an ELO (epitaxial lateral overgrowth) method or selective growth method, the hetero-substrate used as a growth substrate is removed to isolate an elementary nitride semiconductor substrate. Grinding, cutting, etching and laser irradiation are used for removing the hetero-substrate. The nitride semiconductor substrate thus produced is used in the invention. Otherwise, a bulk single crystal formed by a hydrothermal synthesis method by which crystals are grown in a supercritical fluid, a high pressure method or a flux method may be used as the nitride semiconductor substrate.

The vapor phase growth method includes an MOCVD (metal organic chemical vapor deposition) method and HVPE (halide vapor phase epitaxial growth) method. A buffer layer comprising the nitride semiconductor is allowed to grow on a hetero-substrate such as a sapphire, SiC or GaAs substrate. The growth temperature of the buffer layer is 900° C. or less. Then, the nitride semiconductor is grown on the hetero-substrate at a thickness of 50 μm or more. The hetero-substrate is removed thereafter by grinding, electromagnetic wave irradiation (such as irradiation of excimer laser) or CMP (chemical mechanical polishing). The growth surface of the nitride semiconductor serves as a first main surface, while the exposed surface side of the nitride semiconductor substrate exposed by removing the hetero-substrate serves as a second main surface. In this manner, a nitride semiconductor substrate can be obtained.

The first main surface is defined as a C-plane, an A-plane or an M-plane of the nitride semiconductor substrate 101. The first main surface may have a (000-1) plane other than the crystal growth surface of the C-, A- or M-plane. The second main surface of the substrate is preferably the (000-1) plane while a (0001) plane may be also provided. In this specification, the bar (-) representing a plane index represents a bar to be attached on the numeral immediately after the bar. The shape of the outer periphery of the nitride semiconductor substrate is not particularly restricted, and it may be a wafer-shape or rectangular.

Dislocations may be periodically distributed in the crystal plane of the nitride semiconductor substrate 101. For example, a region having a low dislocation density and a region having a high dislocation density are alternately formed as stripes using the ELO method. Since the nitride semiconductor substrate has a function for relaxing internal stress generated inside, it is possible to laminate the nitride semiconductor element at a thickness of 5 μm or more without forming a stress relaxation layer on the substrate. The stripe includes a stripe formed as a broken line. A specific example of the ELO method is a method for allowing the nitride semiconductor to grow again after forming rugged portions on the substrate. The low dislocation density region as used herein refers to a region having a number of dislocations of $1 \times 10^7 / cm^2$ or less, preferably $1 \times 10^6 / cm^2$ or less per unit area. The high dislocation density region may be a region having a higher dislocation density than the above-mentioned low dislocation density region. These dislocations are observed by CL or TEM.

Another example of the nitride semiconductor substrate has a first region containing first n-type impurities on the first main surface of the nitride semiconductor substrate and a second region containing n-type impurities different from those in the first region. The method for forming the first region and second region containing different n-type impurities to one another comprises, during the production step of the nitride semiconductor substrate, the steps of forming the first region by allowing the nitride semiconductor to grow while n-type impurities are doped on the first main surface of the nitride semiconductor substrate, and forming the second region by ion implantation of n-type impurities different from those in the first region on the surface other than the first region. Another example of the method for forming the second region comprises the steps of forming concave portions on the surface of the nitride semiconductor substrate, and allowing the concave portion to recrystallize while n-type impurities different from those in the first region are doped.

An off-angle may be formed on the first main surface and/or second main surface of the nitride semiconductor substrate, or a freshly exposed surface may be formed by gliding the surface by etching and the like. The off-angle is preferably in the range from 0.02° or more to 90° or less, more preferably in the range from 0.05° or more to 5° or less. Forming the off-angle on both surfaces of the substrate is desirable for making succeeding steps easy.

The concentration of the n-type impurity contained in the nitride semiconductor substrate is in the range from $1 \times 10^{17}$ cm$^{-3}$ to $1 \times 10^{20}$ cm$^{-3}$. The thickness of the nitride semiconductor substrate is in the range form 50 μm or more to 1 mm or less, preferably from 50 μm or more to 500 μm or less. The thickness in this range permits the substrate to be cleaved with good reproducibility after forming the nitride semiconductor laser element on the substrate. A thickness of the nitride semiconductor substrate of less than 50 μm makes handling of the substrate in the device step difficult.

Arbitrary rugged portions may be formed on the first main surface of the nitride semiconductor substrate by subjecting the surface to wet etching, dry etching or CMP treatment. Dry etching includes RIE (reactive ion etching), RIBE (reactive ion beam etching), ECR (electron cyclotron resonance), ICP (inductively coupled plasma), FIB (focused ion beam) and the like. The nitride semiconductor substrate partially having different surfaces for crystal growth as described above is preferable for quenching stress and deformation generated on the substrate. Specifically, the substrate has the (0001) plane as the first main surface, and (000-1), (11-20), (10-15), (10-14) and (11-24) planes as crystal growth surfaces different from the (0001) plane.

The second main surface of the nitride semiconductor substrate has at least two different crystal growth surfaces, and preferable examples of the surface include (000-1), (0001), (11-20), (10-15), (10-14) and (11-24) planes. Such nitride semiconductor substrate permits the nitride semiconductor element to grow on the substrate to suppress the stress applied on the element, and is durable against damage given by cleaving.

The nitride semiconductor substrate has a dislocation density of $1 \times 10^6 / cm^2$ or less, preferably $5 \times 10^5 / cm^2$ or less. Life spun characteristics can be improved by forming the waveguide region having a ridge formed on the upper part of the low dislocation region. The nitride semiconductor substrate has a full width at half maximum of the (0002) X-ray diffraction curve of 100 arcsec or less, preferably 60 arcsec or less, as measured by a biaxial crystal method.

The semiconductor layer on the nitride semiconductor substrate 101 is laminated on the first surface of the nitride semiconductor substrate in the following order. The semiconductor layer of the first conductivity type is defined as an n-side semiconductor layer and the semiconductor layer of the second conductivity type is defined as a p-side semiconductor layer in this embodiment. $Al_xGa_{1-x}N (0 \leq x \leq 0.5)$ doped with an n-type impurity and $Al_xGa_{1-x}N (0 \leq x \leq 0.3)$ are grown as an n-side clad layer 203 and an n-side optical guide layer 204, respectively. The active layer 205 is represented by $In_xAl_yGa_{1-x-y}N (0 < x \leq 1, 0 \leq y < 1, 0 < x+y \leq 1)$. Increasing the content of Al permits light emission at an ultraviolet region. Light emission at a long wavelength side in the range from 360 to 580 nm is also possible. Luminous efficiency is improved by forming the active layer 205 as a quantum well structure. The proportion (x) of In in the mixed crystal of the well layer is represented by $0 < x \leq 0.5$. The thickness of the well layer is in the range from 3 to 20 nm, and the thickness of the barrier layer is in the range from 5 to 30 nm. The nitride semiconductor layer is then formed by forming a p-side layer comprising $Al_xGa_{1-x}N (0 \leq x \leq 0.5)$ doped with a p-type impurity as a p-side electron confinement layer 206, $Al_xGa_{1-x}N (0 \leq x \leq 0.3)$ as a p-side optical guide layer 207, $Al_xGa_{1-x}N (0 \leq x \leq 0.5)$ doped with a p-type impurity as a p-side clad layer 208, and $Al_xGa_{1-x}N (0 \leq x \leq 1)$ doped with a p-type impurity as a p-side contact layer 209. The semiconductor layers may be mixed crystals of In. The p-side electron confinement layer 206 may be omitted.

The semiconductor layer 203 of the first conductivity type may comprise an n-side clad layer grown with interposition of a low temperature growth buffer layer 201 on the first main surface of the nitride semiconductor substrate 101, an intermediate layer 202 and a crack preventive layer.

The nitride semiconductor laser element of this embodiment has an SCH structure (separate confinement heterostructure) having the optical guide layers formed on both sides of the active layer. N-side clad layers and p-side clad layers are further formed on both sides the active layer. The clad layer confines the light by providing a nitride semiconductor layer having a low refractive index. The clad layer also has a carrier confinement effect. A stress buffer layer may be provided between respective layers.

The multi-quantum well structure of the active layer may start from the barrier layer and end at the well layer, start from the barrier layer and end at the barrier layer, start form the well layer and end at the barrier layer, or start from the well layer and end at the well layer. Preferably, pairs of multi-quantum well structure starting from the barrier layer and ending at the well layer and starting from the barrier layer and ending at the barrier layer, respectively, are repeated twice to eight times, and the pair finally ends at the barrier layer. The pairs of the well layer and barrier layer repeated twice or three times are preferable for improving the life span characteristics by lowering the threshold current.

The n-side clad layer and p-side clad layer may be either a single layer structure, a dual layer structure or a super lattice structure comprising two layers having different composition ratios to one another. The total thickness of the n-side and p-side clad layer is in the range from 0.4 to 10 µm, and this range is preferable for reducing a forward voltage (Vf). The average composition ratio of Al in the entire clad layer is in the range from 0.02 to 0.1. This range is preferable for suppressing cracks from being generated and for obtaining a sufficient difference of the refractive index between the clad layer and laser waveguide. The dosage of the n-type impurity is in the range from $1\times10^{17}/cm^3$ to $5\times10^{19}/cm^3$. Doping the n-type impurity in this range permits the resistivity to be low while crystallinity is not impaired. The dosage of the p-type impurity is in the range from $1\times10^{19}/cm^3$ to $1\times10^{21}/cm^3$. Crystallinity is not impaired when the content of the p-type impurity is in this range.

The clad layer may be grown on the nitride semiconductor substrate with interposition of an underlayer. The underlayer is represented by $Al_aGa_{1-a}N$ ($0 \leq a \leq 0.5$). This composition permits the dislocations (penetrating dislocations) and pits generated on the surface of the nitride semiconductor to be reduced. The underlayer has a single layer structure or a multilayer laminated structure. When the n-side clad layer is the single layer, it is represented by a general formula $Al_xGa_{1-x}N$ ($0 \leq x \leq 0.2$), and has a thickness in the range from 0.5 to 5 µm. The super-lattice structure is a laminated structure comprising a first layer $Al_xGa_{1-x}N$ ($0 \leq x \leq 0.1$) and a second layer $Al_yGa_{1-y}N$ ($0.01 \leq y \leq 1$) for allowing it to grow as a multilayer.

Examples of the n-type impurity include Si, Ge, Sn, S, O, Ti, Zr and Cd, while examples of the p-type impurity include Mg as well as Be, Zn, Mn, Ga and Sr. The impurity is preferably doped at a concentration in the range from $5\times10^{16}/cm^3$ or more to $1\times10^{21}/cm^3$ or less. When the concentration of the impurity is larger than $1\times10^{21}/cm^3$, crystallinity of the nitride semiconductor layer is impaired and output power tends to be decreased. This tendency is the same in modified doping. The substrate and nitride semiconductor layer are allowed to grow using the vapor phase growth method such as the MOCVD method, HVPE method and molecular beam epitaxy (MBE) method.

(Second Step)

A wafer having a semiconductor layer 2 comprising an n-side semiconductor layer, an active layer and a p-side semiconductor layer laminated on the nitride semiconductor substrate 101 is taken out of a semiconductor growth apparatus.

Then, the n-side semiconductor layer is exposed by etching for stress relaxation. While the exposed surface of the n-side semiconductor layer is not particularly restricted, the surface is exposed up to the n-side clad layer in this embodiment. Etching by the RIE method uses a gas such as $Cl_2$, $CCl_4$, $BCl_3$ and $SiCl_4$.

Then, a waveguide region comprising a striped electric current narrowing region is formed on the p-side semiconductor layer. A protective film comprising $SiO_2$ and the like is formed on the surface of a p-side contact layer as an uppermost layer of the p-side semiconductor layer. This protective layer is patterned for forming the striped waveguide region, and the area except the striped waveguide region is removed by etching. The region is etched by the RIE method using a chlorine-containing gas such as $Cl_2$, $CCl_4$, $SiCl_4$ and $BCl_3$. The width of the ridge portion as the waveguide region is in the range from 1.0 to 50.0 µm. The length of the waveguide region in the direction of stripe is in the range from 300 to 1000 µm. The width of the ridge portion is preferably in the range form 1.0 to 2.0 µm when the laser light is single mode. An output power of 200 mW or more is possible when the width of the ridge portion is 10 µm or more. The height (the depth of etching) of the ridge portion may be in a range sufficient for exposing the p-side optical guide layer. The electric current rapidly expands in a lateral direction below the ridge portion by allowing a large electric current to flow. Accordingly, the depth of etching for forming the ridge portion is preferably up to the p-side optical guide layer.

(Third Step)

After forming the ridge portion as the above-mentioned striped waveguide region, a resist mask (not shown) is formed so that the mask covers a desired range (about 5 µm in width) including the surface of the ridge portion using a photolithography technique. Ions are implanted from the surface of the wafer under a given condition (a dosage in the range from $1\times10^{14}$ to $3\times10^{16}$ atms/cm², and an acceleration voltage in the range from 20 to 200 KeV, preferably from 40 to 200 KeV). The concentration of the impurity and concentration distribution, and the depth of implantation from the surface can be controlled by adjusting the acceleration voltage and implantation time. Examples of the ion species available include H, He, Li, Be, B, C, N, O, F, Ne, Na, Mg, Al, Si, P, S, Cl, Ar, K, Ca, Sc, Ti, V, Vr, Mn, Fe, Co, Ni, Cu, Zn, Ga, Ge, As, Se, Br, Kr, Rb, Sr, Y, Zr, Nb, Mo, Ru, Pd, Ag, Cd, In, Sn, Sb, Te, I, Xe, Cs, Ba, Hf, Ta, W, Ir, Pt, Au, Hg, Pb, Bi, La, Ce, Pr, Nd, Pm, Sm, Eu, Tb, Dy, Er, Tm, Yb and Lu.

The resist mask (not shown) is removed with a stripping solution thereafter.

(Fourth Step)

The side face of the ridge portion is protected thereafter with the embedded insulation film 220. The material of the embedded insulation film is selected from insulating materials having a refractive index smaller than that of the semiconductor layer. Specific examples of the material include $ZrO_2$ and $SiO_2$ as well as oxides of V, Nb, Hf, Ta and Al.

After protecting the side face of the ridge portion with the embedded insulation film, a p-electrode 230 is formed on the surface of the p-side contact layer. The p-electrode is preferably formed on the p-side contact layer and embedded insulation film. The p-electrode has a multilayer structure. For example, when the p-electrode has a dual layer structure comprising Ni and Au, a Ni layer is first formed on the p-side contact layer with a thickness in the range from 5 to 20 nm, and then an Au layer is formed with a thickness in the range from 50 to 300 nm. When the p-electrode has a triple layer structure, the layer comprises a Ni/Au/Pt or Ni/Au/Pd layer. The Ni and Au layers may be the same thickness as that in the dual layer structure, and the Pt or Pd layer as a final layer has a thickness in the range from 50 to 500 nm.

After forming the p-electrode 230, it is subjected to ohmic annealing. Detailed condition is at an annealing temperature of 300° C. or more, preferably 500° C. or more. The atmosphere for annealing contains nitrogen and/or oxygen.

A protective film 240 is formed thereafter on the side face of the n-side semiconductor layer exposed in the foregoing step. Subsequently, a pad electrode 250 is formed on the p-electrode 230. The pad electrode 250 is preferably a laminate comprising metals such as Ni, Ti, Au, Pt, Pd and W. For example, the pad electrode is formed in the order of W/Pd/Au or Ni/Ti/Au from the p-electrode side. While the thickness of the pad electrode is not particularly restricted, the thickness of Au in the final layer is 100 nm or more.

(Fifth Step)

An n-electrode 210 is formed on the second main surface of the nitride semiconductor substrate. The n-electrode is formed on the second main surface of the nitride semiconductor substrate by CVD, sputtering or vacuum deposition. The electrode has at least one selected from the group consisting of Ti, Ni, Au, Pt, Al, Pd, W, Rh, Ag, Mo, V and Hf. The uppermost layer of the multilayer structure of the electrode preferably comprises Pt or Au for enabling heat dissipation from the electrode to be improved. Ohmic characteristics, particularly between the substrate made of the nitride semiconductor and electrode, can be obtained by selecting these materials for the material of the electrode formed on the second main surface. Since adhesiveness between the substrate made of the nitride semiconductor and electrode is excellent, the electrode is efficiently prevented from being peeled in a cleaving step for forming bars or chips from the wafer. The thickness of the n-electrode is 1000 nm or less, preferably 600 nm or less. When the n-electrode has a multilayer structure, the first layer is particularly made of V, Ti, Mo, W or Hf. The thickness of the first layer is 50 nm or less. A thickness of 30 nm or less is preferable for obtaining good ohmic characteristics when the first layer is made of W. The first layer made of V is preferable for improving heat resistance. The thickness of V is in the range from 5 nm or more to 30 nm or less, preferably 7 nm or more to 20 nm or less for obtaining good ohmic characteristics.

The total thickness of the n-electrode 210 comprising Ti/Al is 1000 nm or less, for example the thickness is 10 nm/500 nm. When the n-electrode is formed by laminating Ti/Pt/Au in this order from the second main surface side of the nitride semiconductor layer, each thickness is 6 nm/100 nm/300 nm. When the n-electrode comprises Ti/Mo/Pt/Au from second the main surface side of the nitride semiconductor, each thickness is represented by Ti (6 nm)/Mo (50 nm)/Pt (100 nm)/Au (210 nm). When the n-electrode comprises Ti/Hf/Pt/Au, each thickness is, for example, represented by Ti (6 nm)/Hf (6 nm)/Pt (100 nm)/Au (300 nm). When the electrode comprises Ti/Mo/Ti/Pt/Au laminated in this order, each thickness is represented by Ti (6 nm)/Mo (50 nm)/Ti (50 nm)/Pt (100 nm)/Au (210 nm). When the electrode comprises W/Pt/Au or W/Al/W/Au, the above-mentioned characteristics may be exhibited. Examples of other n-electrode comprises, from the second main surface side of the nitride semiconductor substrate, Hf/Al, Ti/W/Pt/Au, Ti/Pd/Pt/Au, Pd/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au and Cr/W/Pt/Au. The n-electrode may be annealed at a temperature of 300° C. or more after forming the electrode.

The n-electrode 210 is formed into a rectangular shape. The n-electrode is formed by patterning in the region except a region that serves as scribe lines on the second main surface side in a scribe step for forming bars from the nitride semiconductor substrate as a post step. When a metallized electrode (may be omitted) is formed on the n-electrode with the same pattern as the n-electrode, the electrode is readily scribed and cleavability is improved. Examples of the metallized electrode available include Ti/Pt/Au/(Au/Sn), Ti/Pt/Au/(Au/Si), Ti/Pt/Au/(Au/Ge), Ti/Pt/Au/In, Au/Sn, In, Au/Si and Au/Ge.

A terrace may be formed on the second main surface of the nitride semiconductor substrate. Forming the terrace permits an inclined face other than the (000-1)plane to be exposed when the second main surface is the (000-1) plane. For example, crystal plane indices indicating planes other than the (000-1)plane are not specified to one plane, but include (10-15), (10-14)and (11-24) planes. The inclined surface other than the (000-1)plane preferably occupies 0.5% or more, more preferably in the range from 1% or more to 20% or less, of the surface area showing n-polarity.

The terrace has a height of 0.1 μm or more at the interface thereof, and has a tapered or inversely tapered shape. The planar configuration of the terrace comprises concave and/or convex portions with a shape selected from striped, lattice, islet, circular, polygonal, rectangular, comb and mesh shapes. For example, when the convex portion is circular, the diameter of the circular convex portion is 5 μm or more. A width of the concave groove portion of 3 μm or more is preferable for preventing the electrode from being peeled. An off-angle may be formed in the range form 0.2 to 90° for exposing an inclined surface other than the (000-1) plane. Since the second main surface of the nitride semiconductor substrate is provided for forming the n-electrode, ohmic characteristics can be improved by providing the (000-1) plane and planes other than the (000-1) plane. The semiconductor laser element obtained in this embodiment is highly reliable.

(Sixth Step)

After forming the n-electrode 210, the wafer is divided into bars in the direction perpendicular to the striped p-electrode for forming a resonance surface of the semiconductor layer. The resonance surface lies on an M-plane (1-100) and A-plane (11-20). The wafer is divided into the bars by blade breaking, roller breaking or press breaking.

The wafer dividing step is preferably performed in two steps in the semiconductor laser element of the present embodiment. This method permits the resonance surface to be formed with good yield.

Auxiliary cleavage grooves are formed in advance by scribing the nitride semiconductor substrate from the first main surface side or from the second main surface side. The auxiliary cleavage groove is formed on the entire surface of the wafer, or at both ends of the wafer for forming the bars. Preferably, the auxiliary cleavage grooves are formed as broken lines in the cleavage direction for forming the bars with a space apart to one another. This permits the bar to be prevented from being bent in the cleavage direction.

The auxiliary cleavage groove may be formed at the time when the n-type semiconductor layer is exposed by etching in the foregoing (second) step. This permits a step for forming only the cleavage auxiliary groove to be omitted, and the waver dividing step may be simplified.

Subsequently, the wafer is divided into the bars with a breaker. The cleavage method includes blade breaking, roller breaking or press breaking. The n-electrode is partly or entirely formed on the second main surface of the semiconductor substrate.

The wafer can be readily cleaved into the bars by forming the auxiliary cleavage groove on the first main surface and/or second main surface of the nitride semiconductor substrate in advance. Forming the auxiliary cleavage groove on the second main surface of the nitride semiconductor substrate is effective for preventing the electrode formed on the second main surface (back face) from being peeled. A reflection mirror may be formed on the resonance surface formed by cleaving. The reflection mirror is a dielectric multilayer film comprising $SiO_2$, $ZrO_2$, $TiO_2$, $Al_2O_3$ or $Nb_2O_5$. While the reflection mirror is formed on the light reflection side and/or light outgoing side of the resonance surface, it is preferably formed on the light reflection side and light outgoing side of the resonance surface. The resonance surface formed by cleaving permits the reflection mirror to be formed with good reproducibility.

The nitride semiconductor laser element is formed into chips by dividing the bar of the nitride semiconductor substrate in the direction parallel to the stripe direction of the electrode. The chip of the semiconductor laser element is rectangular, and the width of the rectangular resonance surface is 500 µm or less, preferably 400 µm or less. A semiconductor laser element having an opposed electrode structure in which contact resistivity is reduced to $1\times10^{-3}$ $\Omega cm^2$ is thus obtained.

Second Embodiment

Figure 15:
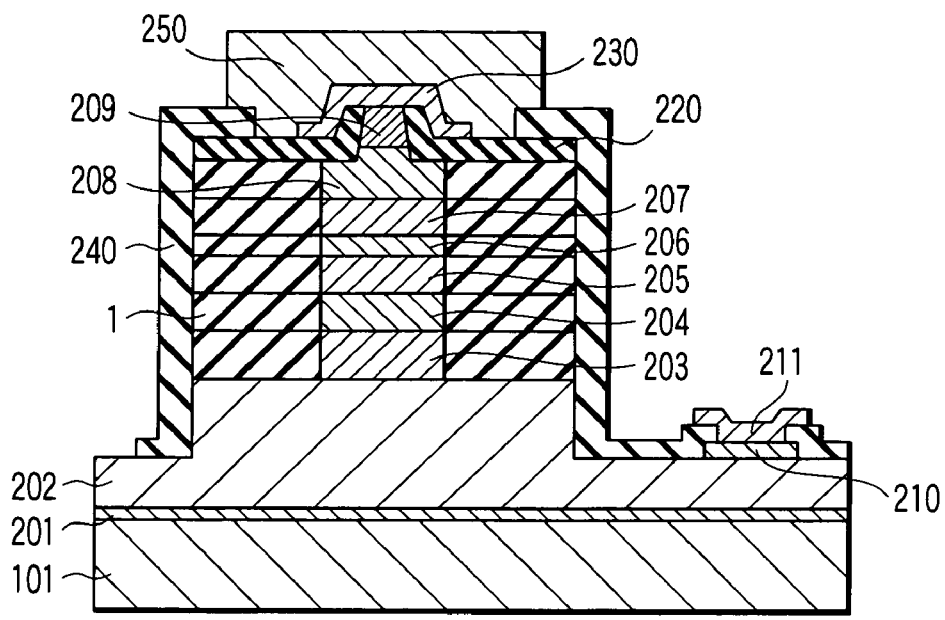
FIG. 15 is a schematic illustration of an example of the cross-sectional structure of the LD according to a second embodiment of the invention.

FIG. 15 is a schematic illustration showing an example of the cross-sectional structure of the LD according to the second embodiment.

The LD shown in FIG. 15 is different from the LD in the first embodiment with respect to the following items, and the others are the same. (1) The n-electrode 210 on the second main surface side is omitted, instead the p-electrode 230 and n-electrode 210 are formed on the first main surface side of the substrate (the LD has an on-the-same-surface electrode structure in which a pair of the electrodes of the LD are formed on one side surface of the chip). While the p-electrode 230 side is formed as in the first embodiment, the n-electrode is able to make direct electrical contact with the semiconductor layer of the first conductivity type by allowing a part of the semiconductor layer 203 of the first conductivity type to be exposed on the n-electrode 210 side, and by allowing a part of the exposed surface to contact the n-electrode 210. (2) The n-side clad layer 203 is grown on the first main surface of the nitride semiconductor substrate 101 with interposition of the low temperature growth buffer layer 201 and intermediate layer 202.

Third Embodiment

In the third embodiment, at least a part of the peripheral region in the direction of thickness of the semiconductor layer of the second conductivity type is changed to the first conductivity type in order to form a region for reducing the capacitance of the element in the peripheral region a given distance or more remote from the waveguide region of the bluish-purple LD, and the width of the depletion layer formed in the pn-junction part is expanded. Consequently, the capacitance of the peripheral region is reduced (the peripheral region is converted into a higher resistance one).

Figure 3:
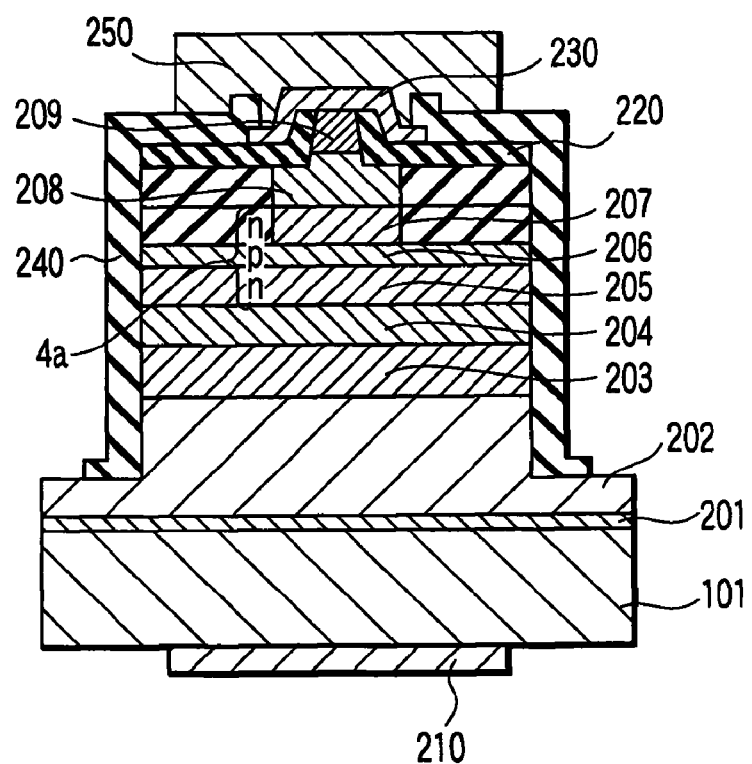
FIG. 3 is a schematic illustration of an example of the cross-section of the LD according to a third embodiment of the invention.

FIG. 3 is a schematic illustration of an example of the cross-sectional structure of the LD according to the third embodiment. The drawing shows an opposed electrode structure in which a pair of the electrodes of the LD are formed by being separated on and under the surfaces of the chip, respectively.

The LD shown in FIG. 3 is different from the LD in the first embodiment with respect to the following items, and the other parts are the same between the embodiments. (1) A region 4a of an npn structure for reducing the capacitance of the element is formed by changing a part of the p-type semiconductor layer (for example the p-type semiconductor layers 208 and 207) into the first conductivity type (n-type) in the direction of thickness in the peripheral region remote from the waveguide region. (2) An n-side clad layer 203 is grown on the first main surface of the nitride semiconductor substrate 101 with interposition of the low temperature growth buffer layer 210 and intermediate layer 202. (3) The protective insulation film 240 is formed so as to cover the entire surface of the embedded insulation film 220 and side edge portion of the first electrode 230.

An example of the method for changing a part of the p-type semiconductor layer in the direction of thickness into the n-type is to form a diffusion region (the portion shown by oblique lines in the drawing) by allowing the n-type impurity to diffuse from the surface side of the p-type clad layer 208. The diffusion method comprises forming an Si-containing layer at a portion to be diffused, and heat-treating the semiconductor layer. The heat treatment temperature and time are appropriately adjusted. The impurity concentration in the diffusion layer and the depth of diffusion from the surface are controlled by adjusting the heat treatment temperature and time. It is preferable to notice the relation between the n-type impurity concentration in the diffusion region and the effect of reducing the capacitance of the element in order to obtain an appropriate impurity concentration.

Modified Example of Third Embodiment

Figure 16:
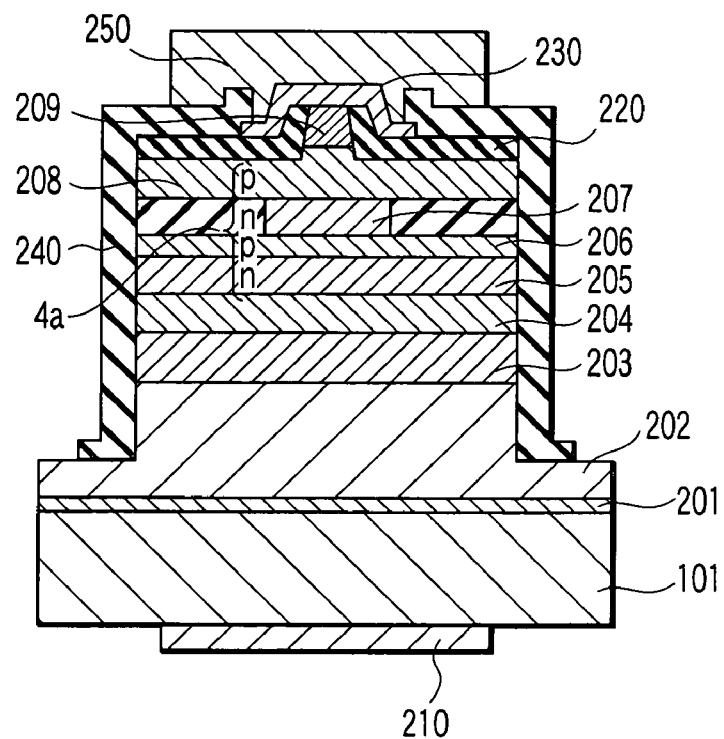
FIG. 16 is a schematic illustration of an example of the cross-sectional structure of the LD according to the third embodiment of the invention.

FIG. 16 is a schematic illustration showing a cross-sectional structure of the LD according to a modified example of the third embodiment. The LD has an opposed electrode structure in which a pair of the electrodes are separated on the upper and lower surfaces of the LD element, respectively.

The LD shown in FIG. 16 is different from the LD in the third embodiment in that a region 4b for reducing the capacitance of the element is formed by changing a part of the p-type semiconductor layer in the direction of thickness (for example, semiconductor layer 207 in the drawing) into the first conductivity type (n-type) to form a pnpn layer (a thyristor structure) in the peripheral region remote from the waveguide region, and by expanding the width of the depletion layer formed at the pn-junction part.

An example for changing a part of the p-type semiconductor layer (for example, semiconductor layer 207 in the drawing) into the n-type is ion implantation of the n-type impurity into the p-type semiconductor layer 207 from the surface side of the p-type clad layer 208. In this case, it is preferable to appropriately determine the n-type impurity concentration in the semiconductor layer 207 by adjusting the ion implantation condition so as to increase the effect of reducing the capacitance of the element.

According to the above-mentioned nitride semiconductor laser element in the third embodiment and modified example thereof, a desired insulative region may be simply obtained since at least a part of the p-type semiconductor layer in the direction of thickness is changed into the n-type in the peripheral region remote from the waveguide region.

Fourth Embodiment

Figure 4:
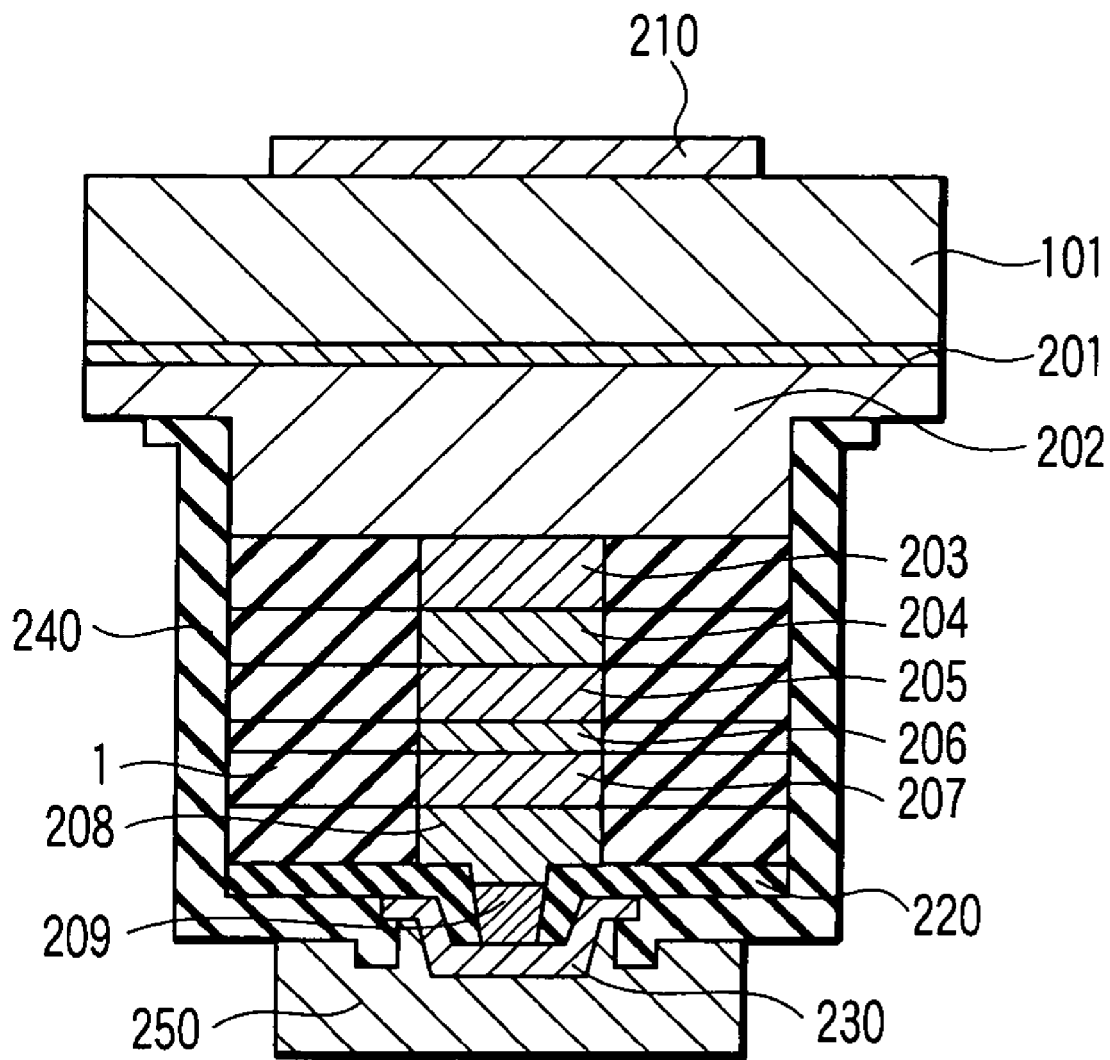
FIG. 4 is a schematic illustration of an example of the cross-section of the LD according to a fourth embodiment of the invention.

FIG. 4 is a schematic illustration of an example of the cross-sectional structure of the LD according to a fourth embodiment.

The LD in FIG. 4 is different from the LD in the first embodiment with respect to the following items, and other portions are the same as those in the first embodiment. (1) The LD has a face-down structure in which a metallized layer (a bump, not shown) is formed on the p-pad electrode 250 for allowing the electrode to contact an external electrode in order to permit the p-electrode 230 side of the semiconductor layer to serve as a mounting surface to a heat sink. (2) The n-side clad layer 203 is grown on the first main surface of the nitride semiconductor substrate 101 with interposition of the low temperature growth buffer layer 201 and intermediate layer 202.

The p-pad electrode 250 may be also used as the metallized layer. The metallized layer comprises a material such as Ag, Au, Sn, In, Bi, Cu or Zn. The nitride semiconductor element having the face-down structure may be provided with good reproducibility by using the nitride semiconductor substrate. Reliability of the LD according to the fourth embodiment is excellent with good heat dissipating ability.

Fifth Embodiment

Figure 17:
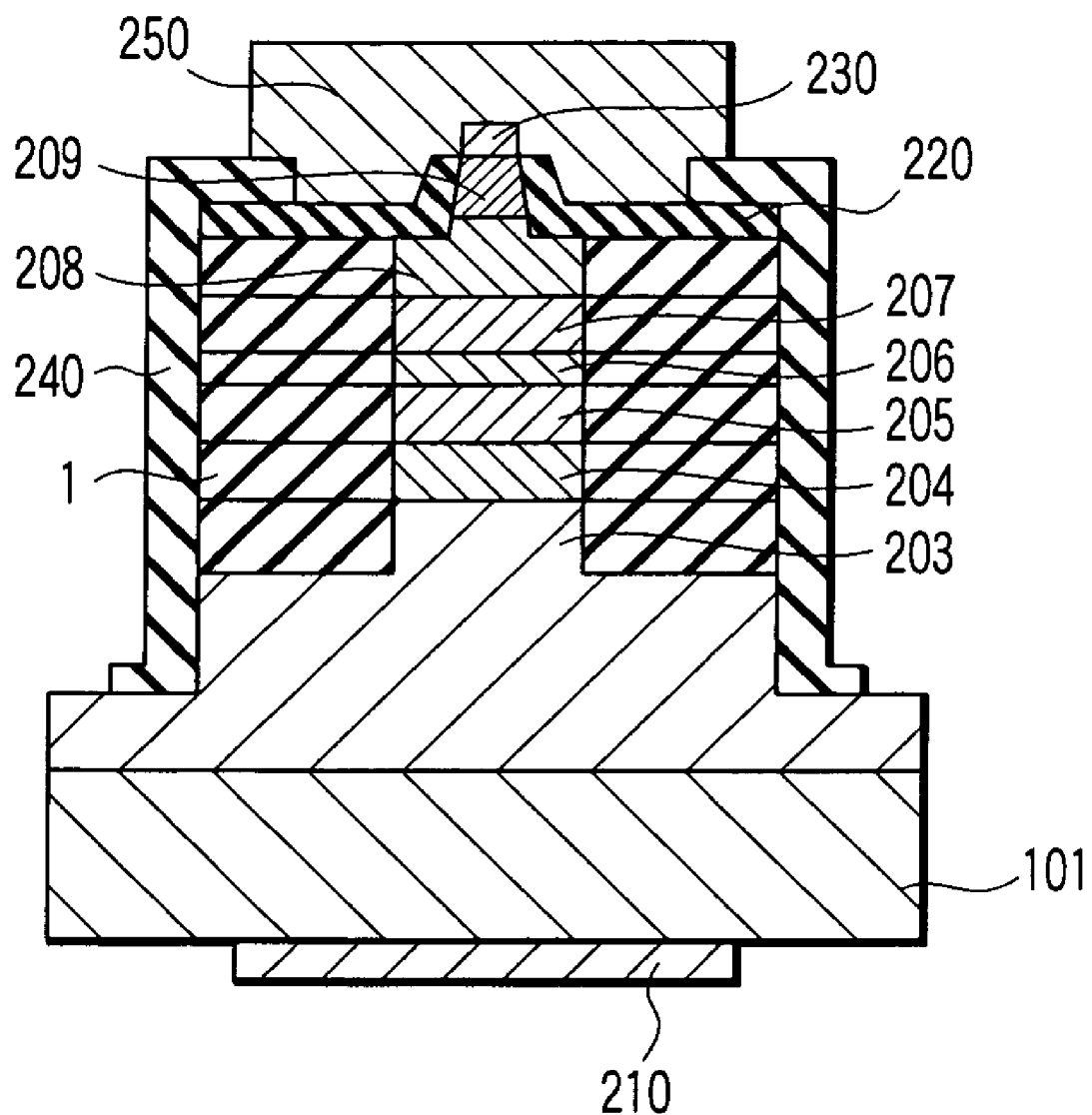
FIG. 17 is a schematic illustration of an example of the cross-sectional structure of the LD according to a fifth embodiment of the invention.

FIG. 17 is a schematic illustration of an example of the cross-sectional structure of the LD according to a fifth embodiment.

In the LD in FIG. 17, the LD is changed so that the p-electrode 230 is formed on only the p-side contact layer 209 of the LD according to the first embodiment. According to this structure, the electrode is never peeled at the interface between the embedded insulation film and p-electrode since the embedded insulation film 220 is not closely adhered to the p-electrode 230.

Other Embodiments

The invention is applicable to a semiconductor laser element having an electric current narrowing layer that is a different structure from the semiconductor laser element comprising the waveguide of the striped ridge shape. The electric current narrowing layer refers to a layer having a function for permitting the electric current to selectively flow. A specific example of the composition of the electric current narrowing layer is AlN. The electric current narrowing layer may be formed between the active layer and p-side contact layer, and is preferably formed on the p-side guide layer. The space between the electric current narrowing layers is in the range from 0.5 to 3 μm. The thickness of the electric current narrowing layer is in the range from 10 nm to 1 μm. This structure permits a semiconductor laser element having a region with a withstand voltage of 10V or more other than the waveguide region in the semiconductor layer to be formed without implanting ions.

The invention also provides a semiconductor laser element having a plurality of waveguide regions on the nitride semiconductor substrate, and a semiconductor laser element having a wide ridge portion.

All methods that are known for growing the nitride semiconductors such as MOVPE (metal-organic vapor phase epitaxy), HVPE (halide vapor phase epitaxy) and MBE (molecular beam epitaxy) may be applied for the practice of the invention.

EXAMPLES

While several examples of the invention are shown below, the invention is not restricted to these examples.

Example 1

FIG. 1 shows a schematic illustration of the cross-sectional structure of the LD in Example 1. In Example 1, the semiconductor layer of the first conductivity type in the above mentioned first embodiment serves as an n-side semiconductor layer, while the semiconductor layer of the second conductivity type serves as a p-side semiconductor layer.

The structure of this LD comprises an n-side clad layer 203, an n-side optical guide layer 204, an active layer 205, a p-side electron confinement layer 206, a p-side optical guide layer 207, a p-side clad layer 208 and a p-side contact layer 209 formed by lamination growth on the first main surface of a GaN substrate 101 as nitride semiconductor layers. A waveguide region having a striped electric current narrowing region is formed in the p-side contact layer 209 and the p-side clad layer 208, and a resonance surface (not shown) is formed on an end surface approximately perpendicular to the waveguide region.

The LD also comprises an embedded insulation film (for example, a $ZrO_2$ film with a thickness of 50 nm) 220 covering the side face of the waveguide region and the surface of the p-type semiconductor layer, a p-electrode 230 making ohmic contact with the surface (upper surface) of the waveguide region and covering the surface of the waveguide region and a part of the surface of the embedded insulation film, a protective insulation film 240 (for example, a $SiO_2$ film with a thickness of 500 nm), a p-pad electrode 250 on the p-electrode, and an n-electrode 210 on the second main surface of the GaN substrate. The protective insulation film 240 is formed so as to cover from the side face of the p-electrode 230 to the surface of the embedded insulation film 220, and side faces of the p-type semiconductor layers 208, 207 and 206, active layer 205, and n-type semiconductor layers 204, 203 and 202.

The n-side clad layer 203 is $Al_xGa_{1-x}N$ ($0 \leq x \leq 0.5$) doped with an n-type impurity, and n-side optical guide layer 204 is $Al_xGa_{1-x}N$ ($0 \leq x \leq 0.3$). The active layer 205 is $In_xAl_yGa_{1-x-y}N$ ($0 < x \leq 1$, $0 < y < 1$, $0 < x+y \leq 1$), and light emission in UV regions is possible by increasing the content of Al. The LD is also able to emit a light at a long wavelength side in the range from 360 to 580 nm. Luminous efficiency is improved by forming the active layer 205 as a quantum well structure. The composition of the well layer comprises In with a proportion of $0 < x \leq 0.5$. The thickness of the well layer is in the range from 3 to 20 nm, while the thickness of the barrier layer is in the range from 5 to 30 nm.

The p-side electron confinement layer 206 comprises $Al_xGa_{1-x}N$ ($0 \leq x \leq 0.5$) doped with a p-type impurity, the p-side optical guide layer 207 comprises $Al_xGa_{1-x}N$ ($0 \leq x \leq 0.3$), the p-side clad layer 208 comprises $Al_xGa_{1-x}N$ ($0 \leq x \leq 0.5$) doped with a p-type impurity, and the p-side contact layer 209 comprises $Al_xGa_{1-x}N$ ($0 \leq x \leq 1$) doped with a p-type impurity. These semiconductor layers may be mixed crystals of In. The electron confinement layer 206 may be omitted.

The nitride semiconductor laser element of Example 1 has an SCH structure in which the optical guide layers 204 and 207 are formed at both sides of the active layer 205. The n-clad layer 203 and p-clad layer 208 are formed on both sides of the optical guide layers, respectively. The clad layer comprises a nitride semiconductor layer having a low refractive index for endowing the layer with a light confinement function. The clad layer also has a carrier confinement function. A stress buffer layer may be provided between the layers.

An insulative region 1 for reducing the capacitance of the element is formed in the peripheral region a give distance or more remote from the waveguide region, provided by converting at least a surface portion of the p-type semiconductor layers 208, 207 and 206, and the active layer 205 into a higher resistance one by ion implantation. As shown in FIG. 2B, when the width of the ridge portion is about 1.6 μm, and the total with of the region for securing safety zones (a zone provided by taking migration of introduced atoms by thermal diffusion into consideration) on the ridge portion and both sides thereof is about 5 μm, the distance (separating distance) between the ridge portion and the insulative region 1 for reducing the capacitance of the element is about 1.7 μm.

Al is used as an ion species, and the ions are bombarded three times. Each bombardment dosage is the same level of $1 \times 10^{16}$ atms/$cm^2$, wherein the acceleration voltage and peak implantation depth are 30 KeV and 50 nm, respectively, in the first bombardment, 45 KeV and 75 nm, respectively, in the second bombardment, and 60 KeV and 100 nm, respectively, in the third bombardment. However, the insulation region for reducing the capacitance of the element can be formed by a small amount of implantation of the ion. Measured data of the bluish-purple LDs of the example and comparative example produced by the above-mentioned process are shown below.

| Sample | Example (ion implantation) | Comparative Example (no ion implantation) |
|---|---|---|
| (1) output 5 mW | 0.40 nsec | 1.03 nsec |
| (2) output 30 mW | 0.34 nsec | 0.87 nsec |

The data above show that each of the rise time tr and fall time tf representing high-speed responsiveness depending on RC of the LD is 0.40 nsec in the sample at an output of 5 mW, which is 40% shorter than that in the comparative example. Each of tr and tf is 0.34 nsec in the sample at an output of 30 mW, which is also 40% shorter than that in the comparative example. In other words, a high-speed responsiveness (tr and tf) of 1 ns or shorter could be obtained in both samples.

FIG. 5 shows an example of distribution of the impurity concentration in the depth direction of the peripheral region of the waveguide region of the bluish-purple LD shown in FIG. 1 when, for example, Al ions are implanted in the region.

As shown in FIG. 5, it is preferable to obtain appropriate distribution of the impurity concentration in the depth direction of the nitride semiconductor layer at the peripheral region of the waveguide region of the bluish-purple LD.

Method of Producing LD in Example 1

A sapphire or GaAs substrate is placed in an MOCVD reaction apparatus, and the temperature is adjusted at 500° C. Then, a buffer layer of GaN is allowed to grow at a thickness of 20 nm using trimethyl gallium (TMG) and ammonia (NH$_3$). After allowing the buffer layer to grow, the temperature is adjusted to 1050° C., and an underlayer comprising GaN is allowed to grow at a thickness of 4 μm.

The wafer is taken out of the reaction vessel after growing the underlayer, a striped photomask is formed on the surface of the underlayer, and a protective film comprising a SiO$_2$ film with a stripe width in the range from 10 to 300 μm and an inter-stripe distance (window) in the range from 5 to 300 μm is formed with a CVD apparatus.

After the protective film is formed, the wafer is transferred to a HVPE (halide vapor phase epitaxy) apparatus, and a nitride semiconductor comprising GaN is allowed to grow at a thickness of 400 μm using Ga metal, HCl gas and ammonia gas as starting materials while oxygen is doped as an n-type impurity. Crystal defects are reduced in the order of two digits or more by allowing the GaN film with a thickness of 100 μm or more to grow while the nitride semiconductor is allowed to grow on the protective film by the HVPE method. The GaN substrate from which the hetero-substrates are peeled by grinding, cutting, CMP or laser irradiation is used as the nitride semiconductor substrate. The thickness of the GaN substrate is about 400 μm. The GaN substrate 101 has a dislocation density of $1 \times 10^6$/cm$^2$ or less at least under a waveguide forming region.

A low temperature growth buffer layer 201, an intermediate layer 202 and a crack preventive layer may be laminated and grown between the semiconductor substrate 101 and n-side clad layer 203 when the semiconductor layers are allowed to grow on the semiconductor substrate 101.

(n-Side Clad Layer 203)

Subsequently, a layer comprising Al$_{0.03}$Ga$_{0.97}$N doped with $1 \times 10^{19}$/cm$^3$ of Si is allowed to grow at a thickness of 2 μm at 1050° C. using TMA (trimethyl aluminum), TMG, ammonia and silane gas. The n-side clad layer may have a supper-lattice structure.

(n-Side Optical Guide Layer 204)

Then, feed of the silane gas is suspended, and the n-side optical guide layer comprising undoped GaN is allowed to grow at 1050° C. at a thickness of 0.175 μm. This n-side optical guide layer may be doped with an n-type impurity.

(Active Layer 205)

Then, a barrier layer comprising Si doped In$_{0.02}$Ga$_{0.98}$N is allowed to grow at a thickness of 14 nm at a temperature of 800° C. Subsequently, a well layer comprising undoped In$_{0.07}$Ga$_{0.93}$N is allowed to grow at a thickness of 7 nm at the same temperature. The barrier layer and well layer is alternately laminated twice, and the layers are finally terminated by the barrier layer to allow an active layer of a multi-quantum well structure (MQW) to grow at a total thickness of 56 nm.

(p-Side Cap Layer 206)

Subsequently, the temperature is raised to 1050° C., and a p-side cap layer comprising p-type Al$_{0.25}$Ga$_{0.75}$N doped with $1 \times 10^{20}$ atms/cm$^3$ of Mg, which has larger band gap energy than the p-side optical guide layer, is allowed to grow at a thickness of 10 nm using TMG, TMA, ammonia, and Cp$_2$Mg (cyclopentadienyl magnesium). The p-side cap layer may be omitted.

(p-Side Optical Guide Layer 207)

Feed of Cp$_2$Mg and TMA is suspended, and a p-side optical guide layer comprising undoped GaN, which has smaller band gap energy than the p-side cap layer 10, is allowed to grow at 1050° C. and at a thickness of 0.14 μm.

(p-Side Clad Layer 208)

Then, a layer comprising undoped Al$_{0.1}$Ga$_{0.90}$N is allowed to grow at a thickness of 2.5 nm at 1050° C., feed of Cp$_2$Mg and TMA is suspended to allow a layer comprising undoped GaN to grow at a thickness of 2.5 nm, and a p-side clad layer comprising a super-lattice structure at a total thickness of 0.4 μm is allowed to grow (p-side contact layer 209).

Finally, a p-side contact layer comprising p-type GaN doped with $1 \times 10^{20}$ atms/cm$^3$ of Mg is allowed to grow at a thickness of 15 nm at 1050° C. on the p-side clad layer.

The wafer on which the nitride semiconductor is grown as described above is taken out of the reaction vessel, a protective film comprising SiO$_2$ is formed on the surface of the p-side contact layer at the uppermost layer, and the protective layer is etched with SiCl$_4$ gas by RIE (reactive ion etching). The n-side clad layer is exposed by the above-mentioned process.

Then, a protective film (not shown) comprising striped SiO$_2$ film is formed on the surface of the p-side contact layer, and a ridge portion that serves as a striped waveguide region is formed by etching with SiCl$_4$ gas by RIE (reactive ion etching).

Subsequently, ions are implanted for forming an insulative region 1 for reducing the capacitance of the element. An ion implantation mask is formed at first except the region corresponding to the insulative region 1 for reducing the capacitance of the element using a photolithography technique, and ions are implanted under a predetermined condition from the surface of the p-type semiconductor layer (from the surface of the wafer). In this Example, ion implantation is applied by bombarding ionized Al three times. The dosage is the same level of $1\times10^{16}$ atms/cm$^2$ for each implantation, and the acceleration voltage and peak implantation depth are 30 KeV and 50 nm, respectively, for the first implantation, 45 KeV and 75 nm, respectively, for the second implantation, and 60 KeV and 100 nm, respectively, for the third implantation. The order of ion implantation from the first to third implantations may be reversed. This means that the acceleration voltage and peak implantation depth may be 60 KeV and 100 nm, respectively, for the first implantation, 45 KeV and 75 nm, respectively, for the second implantation, and 30 KeV and 50 nm, respectively, for the third implantation.

Then, the side face of the ridge portion and the surface of the p-side clad layer 208 are covered with an embedded insulation film 220 comprising ZrO$_2$ for protecting the surface. Subsequently, a p-electrode 230 comprising Ni (10 nm)/Au (150 nm) is formed on the surfaces of the p-side contact layer 209 and the embedded insulation film 220. Ohmic annealing is applied thereafter at 600° C., and a protective film 240 comprising SiO$_2$ is formed on a part of the p-electrode (side end part), on the insulation film 220 and on the side face of the semiconductor layers by sputtering so that the thickness of the film is 0.5 μm. Then, Ni(100 nm)/Ti(100 nm)/Au(800 nm) films are continuously formed on the exposed part of the p-electrode 230 to form a p-pad electrode 250. Then, an n-electrode 210 comprising V(10 nm)/Pt(200 nm)/Au(300 nm) is formed on the second main surface of the nitride semiconductor substrate 101.

Subsequently, convex grooves are formed on the first main surface side of a wafer of the nitride semiconductor substrate on which the n-electrode, p-electrode and p-pad electrode are formed. The depth of the concave groove is 10 μm. The width of the groove is 50 μm and 15 μm in the directions parallel to and perpendicular to the resonance surface, respectively. Then, the LD element is cleaved into bars from the surface side of the nitride semiconductor substrate on which the n-electrode is formed using the concave groove as an auxiliary cleavage line to define the cleaved surface ((1-100) plane, the plane corresponding to the side face of a hexagonal column crystal=M-plane) as a resonance surface.

Then, a dielectric multi-layer film comprising SiO$_2$ and TiO$_2$ is formed on the resonance surface, and finally bars are formed into chips in the direction parallel to the p-electrode to allow the chip to serve as a semiconductor laser element. The length of the resonator is in the range from 300 to 1000 μm. Concave grooves are formed at the right and left corners at the resonance surface side of the nitride semiconductor laser element. The depth of the concave groove is 10 μm, and the width is 30 μm and 10 μm in directions parallel and perpendicular to the resonance surface, respectively.

This laser element is attached to a heat sink, and laser emission is attempted at room temperature by bonding the p-electrode with a wire. Then, laser light is continuously emitted at room temperature at an oscillation wavelength in the range from 400 to 420 nm and a threshold current density of 2.9 kA/cm$^2$. A laser element with good life span characteristics can be produced with good reproducibility without any cleaving damages even when the resonance surface is formed by cleaving, wherein the life span is 10,000 hours under conditions of the light output power CW of 80 mW and an operating temperature of 70° C.

Since the semiconductor laser element in Example 1 is able to obtain an effect of reducing the capacitance of the element, both the rise and fall times of the driving pulse current, which are decisive factors of responsiveness with respect to the input pulse drive current when the element is applied for the laser element for emitting bluish-purple light, are able to be as short as 1 ns or less.

Example 2

While Al ions are implanted for forming the insulative region 1 for reducing the capacitance of the element in Example 1, boron (B) is used in place of Al in Example 2, and the ions are implanted five times (five steps). The ion implantation conditions are an acceleration voltage and a dosage of 10 KeV and $2.8\times10^{14}$ atms/cm$^2$, respectively, for the first implantation; 20 KeV and $4.2\times10^{14}$ atms/cm$^2$, respectively, for the second implantation; 30 KeV and $2.7\times10^{14}$ atms/cm$^2$, respectively, for the third implantation; 40 KeV and $0.8\times10^{14}$ atms/cm$^2$, respectively, for the fourth implantation; and 50 KeV and $1.2\times10^{15}$ atms/cm$^2$, respectively, for the fifth implantation.

The order of the first to fifth implantations may be reversed.

Figure 11:
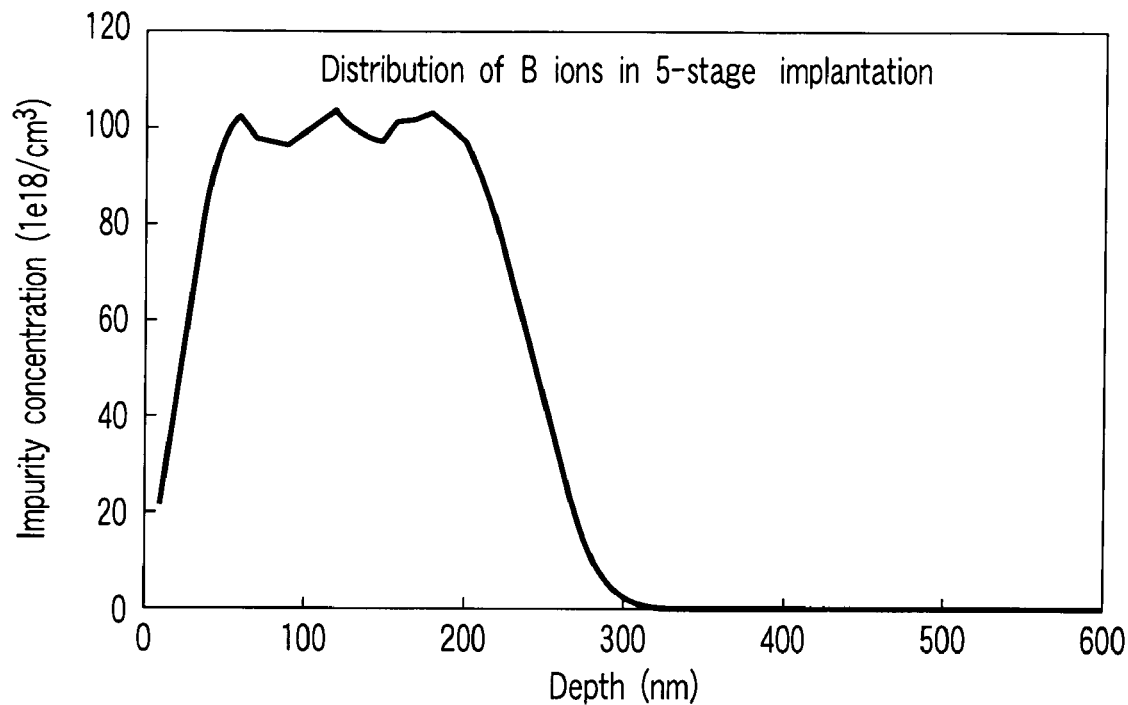
FIG. 11 is an illustrative characteristic graph showing an example of simulation results of the distribution of the impurity concentration in the depth direction of the insulation region formed in Example 2 of the invention.

FIG. 11 is an illustrative characteristic graph showing an example of the result of simulation of the distribution of the impurity concentration (density) in the depth direction of the insulative region 1 formed in Example 2. This characteristic graph shows that the B concentration peak can be adjusted at $1\times10^{20}$ atms/cm$^3$ up to about 0.2 μm (200 nm) in the depth direction of the insulative region 1. The acceleration voltage and dosage (the amount of implanted ions) may be reduced to ½ of those in the ion implantation condition in Example 2, for adjusting the B concentration peak to $5\times10^{19}$ atms/cm$^3$ up to 0.2 μm in the depth direction of the insulative region 1. The acceleration voltage and dosage (the amount of implanted ions) may be reduced to ⅒ of those in the ion implantation condition in Example 2, for adjusting the B concentration peak to $1\times10^{19}$ atms/cm$^3$ up to 0.2 μm in the depth direction of the insulative region 1.

Example 3

While Al ions are implanted for forming the insulative region 1 for reducing the capacitance of the element in Example 1, phosphorous (P) is used in place of Al in Example 3, and the ions are implanted seven times. The ion implantation conditions are an acceleration voltage and a dosage of 10 KeV and $1.0\times10^{14}$ atms/cm$^2$, respectively, for the first implantation; 20 KeV and $1.0\times10^{14}$ atms/cm$^2$, respectively, for the second implantation; 30 KeV and $1.5\times10^{14}$ atms/cm$^2$, respectively, for the third implantation; 50 KeV and $3.0\times10^{14}$ atms/cm$^2$, respectively, for the fourth implantation; 70 KeV and $2.2\times10^{14}$ atms/cm$^2$, respectively, for the fifth implantation; 100 KeV and $2.8\times10^{14}$ atms/cm$^2$, respectively, for the sixth implantation; and 130 KeV and $1.2\times10^{15}$ atms/cm$^2$, respectively, for the seventh implantation.

The order of the first to seventh implantations may be reversed.

Figure 12:
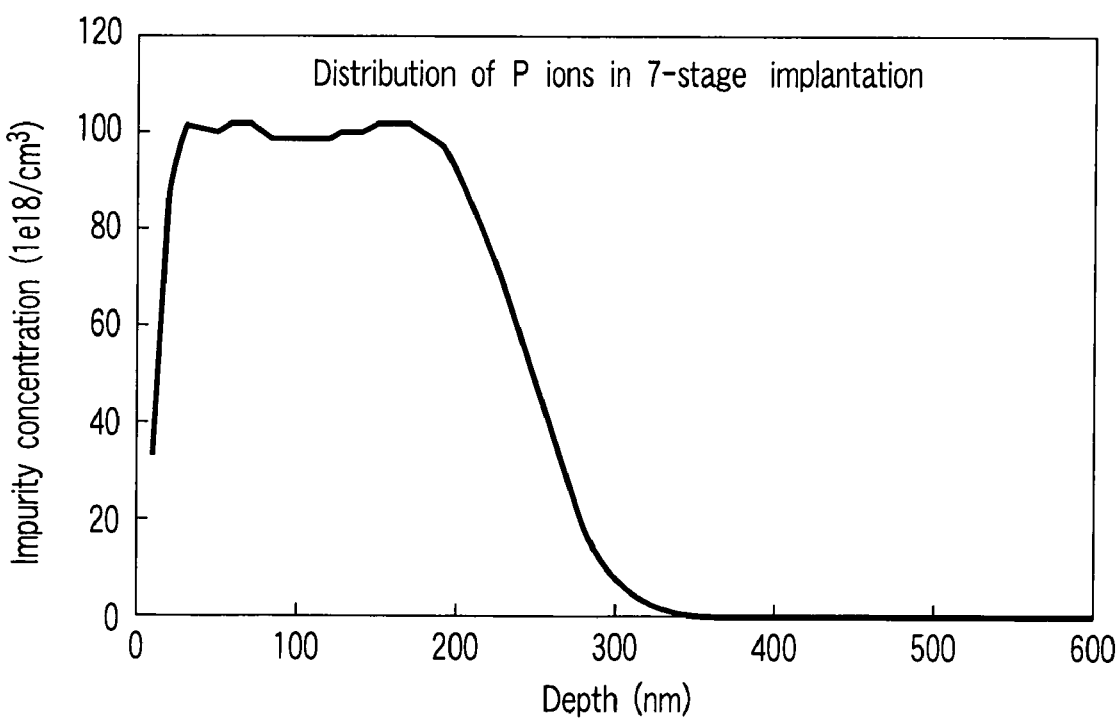
FIG. 12 is an illustrative characteristic graph showing an example of simulation results of the distribution of the impurity concentration in the depth direction of the insulation region formed in Example 3 of the invention.

FIG. 12 is an illustrative characteristic graph showing an example of the result of simulation of the distribution of the impurity concentration (density) in the depth direction of the insulative region 1 formed in Example 3. This characteristic graph shows that the P concentration peak can be adjusted at $1\times10^{20}$ atms/cm$^3$ up to about 0.2 μm (200 nm) in the depth direction of the insulative region 1. The acceleration voltage and dosage (the amount of implanted ions) may be reduced to ½ of those in the ion implantation condition in Example 3, for adjusting the P concentration peak to $5\times10^{19}$ atms/cm$^3$ up to 0.2 μm in the depth direction of the insulative region 1. The acceleration voltage and dosage (the amount of implanted ions) may be reduced to ⅒ of those in the ion implantation condition in Example 3, for adjusting the P concentration peak to $1\times10^{19}$ atms/cm$^3$ up to 0.2 μm in the depth direction of the insulative region 1.

Example 4

While Al ions are implanted for forming the insulative region 1 for reducing the capacitance of the element in Example 1, antimony (Sb) is used in place of Al in Example 4, and the ions are implanted four times. The ion implantation conditions are an acceleration voltage and a dosage of 10 KeV and $1.2\times10^{14}$ atms/cm$^2$, respectively, for the first implantation; 50 KeV and $2.2\times10^{14}$ atms/cm$^2$, respectively, for the second implantation; 100 KeV and $1.5\times10^{14}$ atms/cm$^2$, respectively, for the third implantation; and 180 KeV and $6.2\times10^{14}$ atms/cm$^2$, respectively, for the fourth implantation. The acceleration voltage of 180 KeV is the maximum energy capable of supplying a stable maximum current of monovalent ions with a currently available accelerator with an acceleration capacity of 200 KeV.

The order of the first to fourth ion implantations may be reversed.

Figure 13:
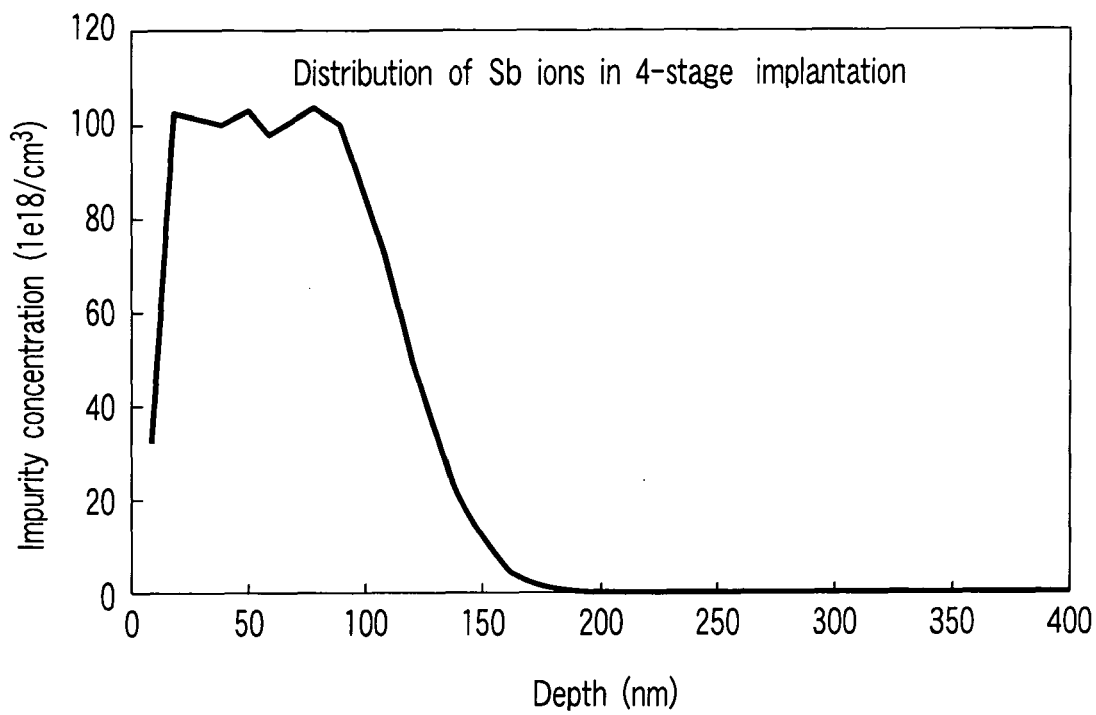
FIG. 13 is an illustrative characteristic graph showing an example of simulation results of the distribution of the impurity concentration in the depth direction of the insulation region formed in Example 4 of the invention.

FIG. 13 is an illustrative characteristic graph showing an example of the result of simulation of the distribution of the impurity concentration (density) in the depth direction of the insulative region 1 formed in Example 4. This characteristic graph shows that the Sb concentration peak can be adjusted at $1\times10^{20}$ atms/cm$^3$ up to about 90 nm in the depth direction of the insulative region 1. The acceleration voltage and dosage (the amount of implanted ions) may be reduced to ½ of those in the ion implantation condition in Example 4, for adjusting the Sb concentration peak to $5\times10^{19}$ atms/cm$^3$ up to about 90 nm in the depth direction of the insulative region 1. The acceleration voltage and dosage (the amount of implanted ions) may be reduced to 1/10 of those in the ion implantation condition in Example 4, for adjusting the Sb concentration peak to $1\times10^{19}$ atms/cm$^3$ up to about 90 nm in the depth direction of the insulative region 1.

Example 5

While Al ions are implanted for forming the insulative region 1 for reducing the capacitance of the element in Example 1, antimony (Sb) is used in place of Al in Example 5, and the ions are implanted five times. The ion implantation conditions are an acceleration voltage and a dosage of 10 KeV and $7.5\times10^{13}$ atms/cm$^2$, respectively, for the first implantation; 30 KeV and $1.3\times10^{13}$ atms/cm$^2$, respectively, for the second implantation; 70 KeV and $2.0\times10^{14}$ atms/cm$^2$, respectively, for the third implantation; 100 KeV and $6.5\times10^{14}$ atms/cm$^2$, respectively, for the fourth implantation; and 180 KeV and $6.4\times10^{14}$ atms/cm$^2$, respectively, for the fourth implantation. The acceleration voltage of 180 KeV is the maximum energy capable of supplying a stable maximum current of monovalent ions with a currently available accelerator having an acceleration capacity of 200 KeV.

The order of the first to fifth ion implantations may be reversed.

Figure 14:
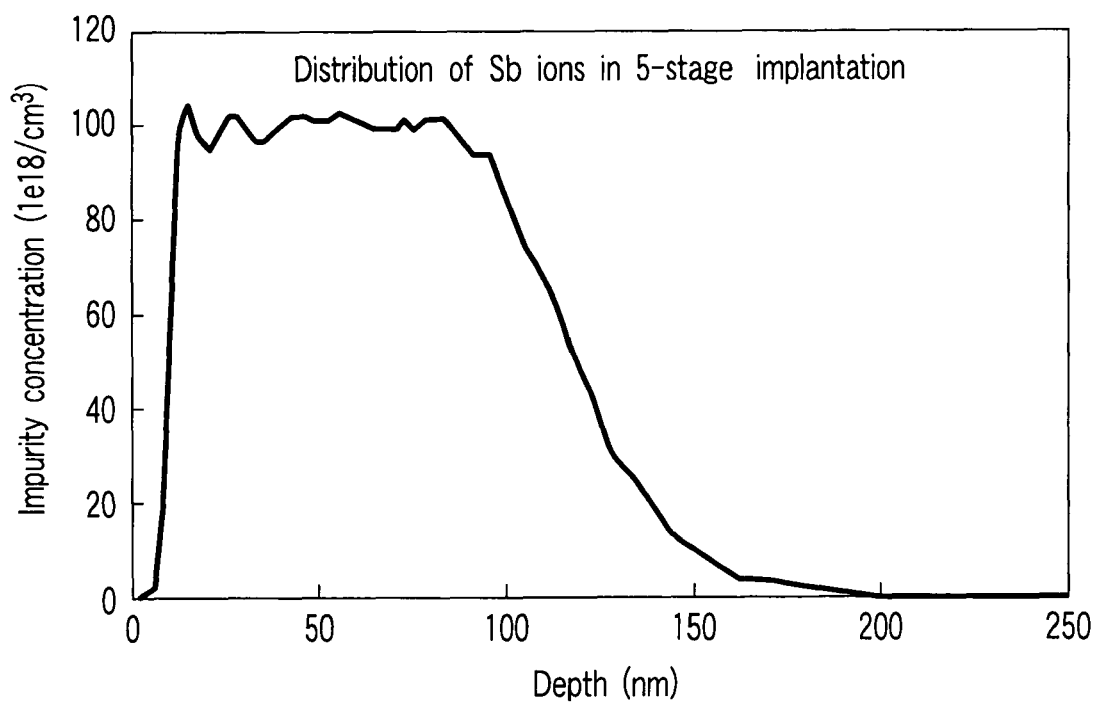
FIG. 14 is an illustrative characteristic graph showing an example of simulation results of the distribution of the impurity concentration in the depth direction of the insulation region formed in Example 5 of the invention.

FIG. 14 is an illustrative characteristic graph showing an example of the result of simulation of the distribution of the impurity concentration (density) in the depth direction of the insulative region 1 formed in Example 5. This characteristic graph shows that the Sb concentration peak can be adjusted at $1\times10^{20}$ atms/cm$^3$ up to about 90 nm in the depth direction of the insulative region 1. The acceleration voltage and dosage (the amount of implanted ions) may be reduced to ½ of those in the ion implantation condition in Example 5, for adjusting the Sb concentration peak to $5\times10^{19}$ atms/cm$^3$ up to about 90 nm in the depth direction of the insulative region 1. The acceleration voltage and dosage (the amount of implanted ions) may be reduced to 1/10 of those in the ion implantation condition in Example 5, for adjusting the Sb concentration peak to $1\times10^{19}$ atms/cm$^3$ up to about 90 nm in the depth direction of the insulative region 1.

Example 6

While Al ions are implanted for forming the insulative region 1 for reducing the capacitance of the element in Example 1, an AlxOy region may be formed so that a peak concentration is obtained up to about 0.1 μm (100 nm) in the depth direction of the insulative region 1, by one implantation of Al ions and one implantation of oxygen (O) ions at an acceleration voltage of 40 KeV and 60 KeV, respectively.

Example 7

In the conditions for producing the nitride semiconductor substrate 101 in Example 1 using the HVPE apparatus, silane gas is added to the starting material, and a nitride semiconductor substrate comprising GaN doped with silicon (Si) or oxygen (O) at a concentration of $1\times10^{18}$ atoms/cm$^3$ is grown at a thickness of 500 μpm in Example 7. The Si concentration is desirably in the range from $1\times10^{17}$ atoms/cm$^3$ to $5\times10^{19}$ atoms/cm$^3$. After allowing the nitride semiconductor substrate to grow, the sapphire substrate and buffer layer are removed by laser irradiation or grinding as in Example 1 obtain a nitride semiconductor substrate 101. A laser element having characteristics comparable to those in Example 1 may be efficiently obtained by forming a nitride semiconductor laser element under the same conditions as in Example 1, except for the above-described conditions.

Example 8

In the conditions for producing the nitride semiconductor substrate in Example 1, an n-side clad layer is grown on the nitride semiconductor substrate 101 with interposition of an intermediate layer 202 in Example 8. A semiconductor laser element is formed under the same conditions as in Example 1, except for the above-mentioned conditions.

The intermediate layer 202 is grown at a thickness of 4 μm on the nitride semiconductor substrate 101 comprising GaN doped with Si at 1050° C. at a concentration of $3\times10^{18}$ atoms/cm$^3$, using ammonia and TMG, and silane gas as impurity gas.

Example 9

In the conditions for producing the nitride semiconductor substrate in Example 1, an n-side clad layer is grown on the nitride semiconductor substrate 101 with interposition of an intermediate layer 202 and a crack preventive layer in Example 9. A semiconductor laser element is formed under the same conditions as in Example 1, except for the above-mentioned condisions.

The crack preventive layer comprising In$_{0.06}$Ga$_{0.94}$N is grown at a thickness of 0.15 μm at a temperature of 800° C. using TMG, TMI (trimethyl indium) and ammonia.

Example 10

In the nitride semiconductor substrate in Example 1, the n-side clad layer has a super-lattice structure in Example 10. A semiconductor laser element is formed under the same conditions in Example 1, except for the above-mentioned condition. For forming the n-side clad layer in this example, a layer comprising undoped Al$_{0.1}$Ga$_{0.9}$N is grown at a thickness of 2.5 nm at 1050° C. using TMA (trimethyl aluminum), TMG and ammonia, supply of TMA is suspended and silane gas is supplied, and a layer comprising n-type GaN doped with Si at a concentration of $1 \times 10^{19}$ atms/cm$^3$ is grown at a thickness of 2.5 nm. A super-lattice layer is constructed by alternately laminating these layers to form a layer with a total thickness of 2 μm.

Example 11

FIG. 3 illustrates a cross-sectional structure of the LD in Example 11. This drawing shows an opposed electrode structure in which a pair of electrodes of the LD are separated on and under the chip.

This structure of the LD is different from the LD in Example 1 in that the region 4a for reducing the capacitance of the element is formed by forming an npn structure in which a part of the p-type semiconductor layer is changed into an n-type in the direction of thickness in the region remote from the waveguide region, and other parts are the same between them.

For changing a part of the p-type semiconductor layer into the n-type in the direction of thickness, an n-type impurity layer (for example, an Si layer) is formed at the side of the surface of the p-type clad layer, and the element is heat-treated in an annealing furnace for a given time. The heat treatment temperature is appropriately controlled, for example in the range form 400° C. to 700° C. The heat treatment time is also appropriately controlled, for example in the range from 10 minutes to 2 hours. A region having a desired impurity concentration, concentration distribution and diffusion depth may be obtained by controlling the heat treatment temperature and time.

INDUSTRIAL APPLICABILITY

The nitride semiconductor laser element of the invention may be used for various devices using semiconductor laser elements such as optical disk recording/playback apparatuses, optical communication systems, printing machines and measuring instruments.

The invention claimed is:

1. A nitride semiconductor laser element comprising:
  a semiconductor stacked structure including a semiconductor layer of a first conductivity type, an active layer and a semiconductor layer of a second conductivity type, which are stacked one upon the other and each comprises a nitride, wherein the semiconductor stacked structure defines, when viewed in plan, a quadrangle having four right angles and having a first edge, a second edge opposing the first edge, a third short edge and a fourth short edge opposing the third short edge; a striped waveguide region for a laser light provided on the semiconductor layer of the second conductivity type, wherein the striped waveqiude region extends parallel to the first/second edges of the quadrangle;
  and an insulative region for reducing the capacitance of the element, wherein a pn-junction of the semiconductor layer at a peripheral region remote from the waveguide region is broken, forming the insulative region, wherein the insulative region defines a rectangle when viewed in plan, the rectangle having a first long edge extending parallel to a longitudinal direction of the striped waveqiude region, a second long edge opposing the first long edge and positioned nearer to the striped waveqiude region than the first long edge, a first short edge and a second short edge opposing the first short edge, with the first short edge being positioned nearer to the third short edge of the quadrangle than the second short edge, wherein the first long edge of the rectangle is remote from the first edge of the quadrangle, and the first and second short edges of the rectangle are remote from the third and fourth short edges of the quadrangle, respectively.

2. The nitride semiconductor laser element according to claim 1, wherein the insulative region for reducing the capacitance of the element is a region formed by implanting ions from the surface of the semiconductor layer of the second conductivity type.

3. A nitride semiconductor laser element comprising:
  a substrate; a semiconductor stacked structure including a semiconductor layer of a first conductivity type, an active layer and a semiconductor layer of a second conductivity type, which are stacked on a main surface of the substrate and each comprises a nitride, wherein the semiconductor stacked structure defines, when viewed in plan, a quadrangle having four right angles and having a first edge, a second edge opposing the first edge, a third short edge and a fourth short edge opposing the third short edge;
  a striped waveguide region for a laser light provided on the semiconductor layer of the second conductivity type, wherein the striped waveguide region extends parallel to the first/second edges of the quadrangle; an embedded insulation film covering a side face of the waveguide region and a surface of the semiconductor layer of the second conductivity type; a first electrode in contact with a surface of the waveguide region; a protective insulation film covering at least a part of the embedded insulation film; a second electrode substantially connected to the semiconductor layer of the first conductivity type; and an insulative region for reducing the capacitance of the element, provided by converting at least a part of the semiconductor layer at a peripheral region remote from the waveguide region into a higher resistance one by ion implantation, wherein the insulative region defines a rectangle when viewed in plan, the rectangle having a first long edge extending parallel to a longitudinal direction of the striped waveguide region, a second long edge opposing the first long edge and positioned nearer to the striped waveguide region than the first long edge, a first short edge and a second short edge opposing the first short edge, with the first short edge being positioned nearer to the third short edge of the quadrangle than the second short edge, wherein the first long edge of the rectangle is remote from the first edge of the quadrangle, and the first and second short edges of the rectangle are remote from the third and fourth short edges of the quadrangle, respectively.

4. The nitride semiconductor laser element according to claim 1, wherein the insulative region for reducing the capacitance of the element has an impurity peak concentration in the range from $1 \times 10^{18}$ to $5 \times 10^{21}$ atms/cm$^3$.

5. The nitride semiconductor laser element according to claim 1, wherein the insulative region for reducing the capacitance of the element has a peak of distribution of the impurity concentration in the depth direction in the range from 200 nm to 1 μm from the surface of the semiconductor layer of the second conductivity type.

6. The nitride semiconductor laser element according to claim 3, wherein the first electrode is formed in contact with the surface of the waveguide region so as to cover a part of the embedded insulation film, a pad electrode is formed in contact with the first electrode so as to cover a part of the protective insulation film, and the insulative region for reducing the capacitance of the element includes a region below the embedded insulation film.

7. The nitride semiconductor laser element according to claim 3, wherein the first electrode is formed in contact with the surface of the waveguide region so as to cover a part of the embedded insulation film, a pad electrode is formed in contact with the first electrode so as to cover a part of the protective insulation film, and the insulative region for reducing the capacitance of the element includes a region below the first electrode or the pad electrode.

8. The nitride semiconductor laser element according to claim 1, wherein the semiconductor laser element is a laser element for emitting bluish-purple light, and has responsiveness to input of pulse drive current of 1 ns or less.

9. A nitride semiconductor laser element comprising:
a semiconductor stacked structure including a semiconductor layer of a first conductivity type, an active layer and a semiconductor layer of a second conductivity type being different from the first conductivity type, which are stacked on a main surface of a substrate and each comprises a nitride, wherein the semiconductor stacked structure defines, when viewed in plan, a quadrangle having four right angles and having a first edge, a second edge opposing the first edge, a third short edge and a fourth short edge opposing the third short edge; and a striped waveguide region for a laser light provided on the semiconductor layer of the second conductivity type, wherein the striped waveguide region extends parallel to the first/second edges of the quadrangle, wherein at least a part of the semiconductor layer of the second conductivity type serves as a region for reducing the capacitance of the element by being converted into the first conductivity type in a direction of thickness at a peripheral region remote from the waveguide region, wherein the region for reducing the capacitance of the element defines a rectangle when viewed in plan, the rectangle having a first long edge extending parallel to a longitudinal direction of the striped waveguide region, a second long edge opposing the first long edge and positioned nearer to the striped waveguide region than the first long edge, a first short edge and a second short edge opposing the first short edge, with the first short edge being positioned nearer to the third short edge of the quadrangle than the second short edge, wherein the first long edge of the rectangle is remote from the first edge of the quadrangle, and the first and second short edges of the rectangle are remote from the third and fourth short edges of the quadrangle, respectively.

10. The nitride semiconductor laser element according to claim 9, having an npn structure in the peripheral region remote from the waveguide region, wherein the semiconductor layer of the first conductivity type is an n-type semiconductor layer, and the semiconductor layer of the second conductivity type is a p-type semiconductor layer.

11. The nitride semiconductor laser element according to claim 9, having a pnpn structure in the peripheral region remote from the waveguide region, wherein the semiconductor layer of the first conductivity type is an n-type semiconductor layer, and the semiconductor layer of the second conductivity type is a p-type semiconductor layer.

12. A bluish-purple light emitting laser element comprising: a semiconductor stacked structure including a semiconductor layer of a first conductivity type, an active layer and a semiconductor layer of a second conductivity type, which are stacked one upon the other and each comprises a nitride, wherein the semiconductor stacked structure defines, when viewed in plan, a quadrangle having four right angles and having a first edge, a second edge opposing the first edge, a third short edge and a fourth short edge opposing the third short edge; and a striped waveguide region of a laser light provided on the semiconductor layer of the second conductivity type, wherein the striped waveguide region extends parallel to the first/second edges of the quadrangle, wherein the element comprises an insulation region for reducing the capacitance of the element in a peripheral region remote from the waveguide region, wherein the region for reducing the capacitance of the element defines a rectangle when viewed in plan, the rectangle having a first long edge extending parallel to a longitudinal direction of the striped waveguide region, a second long edge opposing the first long edge and positioned nearer to the striped waveguide region than the first long edge, a first short edge and a second short edge opposing the first short edge, with the first short edge being positioned nearer to the third short edge of the quadrangle than the second short edge, wherein the first long edge of the rectangle is remote from the first edge of the quadrangle, and the first and second short edges of the rectangle are remote from the third and fourth short edges of the quadrangle, respectively.

13. The nitride semiconductor laser element according to claim 3, wherein the first electrode is formed in contact with the surface of the waveguide region so as to cover a part of the embedded insulation film, and the insulative region for reducing the capacitance of the element includes a region below the first electrode.

14. The nitride semiconductor laser element according to claim 3, wherein the insulative region for reducing the capacitance of the element is present remote from a resonance surface of the semiconductor element.

15. The nitride semiconductor element according to claim 1, wherein the semiconductor stacked structure is rectangular when viewed in plan.

16. The nitride semiconductor element according to claim 3, wherein the semiconductor stacked structure is rectangular when viewed in plan.

17. The nitride semiconductor element according to claim 9, wherein the semiconductor stacked structure is rectangular when viewed in plan.

18. The nitride semiconductor element according to claim 12, wherein the semiconductor stacked structure is rectangular when viewed in plan.

19. The nitride semiconductor laser element according to claim 3, wherein a plurality of the insulative region are provided along the striped waveguide region, spaced from each other.

20. The nitride semiconductor laser element according to claim 3, wherein the insulative region is provided so that portion thereof facing the waveguide region is rugged.

* * * * *